(12) United States Patent
Aoki

(10) Patent No.: US 11,342,877 B2
(45) Date of Patent: May 24, 2022

(54) CONTROLLER OF ROTATING ELECTRIC MACHINE

(71) Applicant: DENSO CORPORATION, Kariya (JP)

(72) Inventor: Yasuaki Aoki, Kariya (JP)

(73) Assignee: DENSO CORPORATION, Kariya (JP)

( * ) Notice: Subject to any disclaimer, the term of this patent is extended or adjusted under 35 U.S.C. 154(b) by 106 days.

(21) Appl. No.: 16/662,367

(22) Filed: Oct. 24, 2019

(65) Prior Publication Data
US 2020/0136549 A1 Apr. 30, 2020

(30) Foreign Application Priority Data
Oct. 26, 2018 (JP) .............................. JP2018-202109

(51) Int. Cl.
| | |
|---|---|
| *H02K 11/00* | (2016.01) |
| *H02P 27/08* | (2006.01) |
| *H02P 6/16* | (2016.01) |
| *H02P 6/06* | (2006.01) |
| *H02M 7/5395* | (2006.01) |
| *G01R 19/00* | (2006.01) |
| *B62D 5/04* | (2006.01) |
| *H02P 25/092* | (2016.01) |

(52) U.S. Cl.
CPC .............. *H02P 27/08* (2013.01); *B62D 5/046* (2013.01); *G01R 19/0092* (2013.01); *H02M 7/5395* (2013.01); *H02P 6/06* (2013.01); *H02P 6/16* (2013.01); *H02P 25/092* (2016.02)

(58) Field of Classification Search
CPC .. B62D 5/046; G01R 19/0092; G01R 31/343; H02M 2001/0009; H02M 2007/53876; H02M 7/5395; H02P 2203/09; H02P 25/092; H02P 27/08; H02P 6/06; H02P 6/16
See application file for complete search history.

(56) References Cited

U.S. PATENT DOCUMENTS

| | | | | |
|---|---|---|---|---|
| 2001/0002784 A1* | 6/2001 | Masaki | ...................... | H02P 6/18 318/727 |
| 2005/0160771 A1* | 7/2005 | Hosoito | ................ | D06F 37/304 68/12.16 |
| 2008/0246426 A1* | 10/2008 | Aoki | .................. | H02M 7/53873 318/461 |

(Continued)

FOREIGN PATENT DOCUMENTS

| | | |
|---|---|---|
| JP | H06-351280 A | 12/1994 |
| JP | 3454212 B2 | 10/2003 |
| JP | 2011-66974 A | 3/2011 |

*Primary Examiner* — Muhammad S Islam
(74) *Attorney, Agent, or Firm* — Maschoff Brennan

(57) ABSTRACT

A controller of a rotating electric machine includes a current detector detecting a voltage of each of shunt resistors in at least two phases from among the shunt resistors in three phases during an electric current flowing period in which the shunt resistors in the at least two phases have an electric current flowing therein; and a signal generator setting a switching mode of each of switches forming an inverter for controlling an estimated angular velocity to an instruction angular velocity based on the detected voltage. The signal generator sets a switching mode to flow the electric current in the shunt resistors in the at least two phases during at least part of one half of a modulation cycle of control of the estimated angular velocity.

16 Claims, 21 Drawing Sheets

(56) References Cited

U.S. PATENT DOCUMENTS

| | | | |
|---|---|---|---|
| 2010/0231150 A1* | 9/2010 | Tan | H02M 7/53873 318/400.3 |
| 2011/0006598 A1* | 1/2011 | Yamakawa | H02P 6/08 307/9.1 |
| 2011/0156619 A1* | 6/2011 | Nomura | H02P 25/06 318/135 |
| 2012/0001573 A1* | 1/2012 | Kimpara | H02P 29/032 318/400.02 |
| 2012/0068645 A1* | 3/2012 | Tsuji | H02M 1/32 318/400.21 |
| 2012/0194109 A1* | 8/2012 | Uryu | B62D 5/046 318/400.15 |
| 2012/0268046 A1* | 10/2012 | Yamazaki | H02P 21/26 318/400.02 |
| 2013/0320905 A1* | 12/2013 | Uryu | B62D 5/0403 318/490 |
| 2014/0210385 A1* | 7/2014 | Kozaki | F04D 27/0261 318/400.02 |
| 2015/0008860 A1 | 1/2015 | Lee | |
| 2015/0145448 A1 | 5/2015 | Mukai et al. | |
| 2016/0028339 A1* | 1/2016 | Nakai | H02P 29/50 318/400.02 |
| 2017/0201201 A1 | 7/2017 | Aoki et al. | |
| 2017/0366101 A1* | 12/2017 | Suzuki | H02P 21/0003 |
| 2018/0029635 A1* | 2/2018 | Kuroda | B62D 3/12 |

\* cited by examiner

FIG. 3

| VOLTAGE VECTOR | ON SWITCH | | | ARM |
|---|---|---|---|---|
| V0 | SUn | SVn | SWn | -IU, -IV, -IW |
| V1 | SUp | SVn | SWn | -IV, -IW |
| V2 | SUp | SVp | SWn | -IW |
| V3 | SUn | SVp | SWn | -IU, -IW |
| V4 | SUn | SVp | SWp | -IU |
| V5 | SUn | SVn | SWp | -IU, -IV |
| V6 | SUp | SVn | SWp | -IV |
| V7 | SUp | SVp | SWp | UNDETECTABLE |

| VOLTAGE VECTOR | ON SWITCH | | | ARM |
|---|---|---|---|---|
| V0 | SUn | SVn | SWn | UNDETECTABLE |
| V1 | SUp | SVn | SWn | IU |
| V2 | SUp | SVp | SWn | IU, IV |
| V3 | SUn | SVp | SWn | IV |
| V4 | SUn | SVp | SWp | IV, IW |
| V5 | SUn | SVn | SWp | IW |
| V6 | SUp | SVn | SWp | IU, IW |
| V7 | SUp | SVp | SWp | IU, IV, IW |

FIG. 13

60 DEG VOLTAGE VECTOR RATIO

| SEC \ VEC | V0 | V1 | V2 | V3 | V4 | V5 | V6 | V7 |
|---|---|---|---|---|---|---|---|---|
| 1 | $1-\dfrac{\dfrac{v_u-v_w}{E_d}}{2}$ | $\dfrac{v_u-v_v}{E_d}$ | $\dfrac{v_v-v_w}{E_d}$ | 0 | 0 | 0 | 0 | $1-\dfrac{\dfrac{v_u-v_w}{E_d}}{2}$ |
| 2 | $1-\dfrac{\dfrac{v_v-v_u}{E_d}}{2}$ | 0 | $\dfrac{v_u-v_w}{E_d}$ | $\dfrac{v_v-v_u}{E_d}$ | 0 | 0 | 0 | $1-\dfrac{\dfrac{v_v-v_w}{E_d}}{2}$ |
| 3 | $1-\dfrac{\dfrac{v_v-v_u}{E_d}}{2}$ | 0 | 0 | $\dfrac{v_v-v_w}{E_d}$ | $\dfrac{v_w-v_u}{E_d}$ | 0 | 0 | $1-\dfrac{\dfrac{v_v-v_u}{E_d}}{2}$ |
| 4 | $1-\dfrac{\dfrac{v_w-v_u}{E_d}}{2}$ | 0 | 0 | 0 | $\dfrac{v_v-v_u}{E_d}$ | $\dfrac{v_w-v_v}{E_d}$ | 0 | $1-\dfrac{\dfrac{v_w-v_u}{E_d}}{2}$ |
| 5 | $1-\dfrac{\dfrac{v_w-v_v}{E_d}}{2}$ | 0 | 0 | 0 | 0 | $\dfrac{v_w-v_u}{E_d}$ | $\dfrac{v_u-v_v}{E_d}$ | $1-\dfrac{\dfrac{v_w-v_v}{E_d}}{2}$ |
| 6 | $1-\dfrac{\dfrac{v_u-v_v}{E_d}}{2}$ | $\dfrac{v_u-v_w}{E_d}$ | 0 | 0 | 0 | 0 | $\dfrac{v_w-v_v}{E_d}$ | $1-\dfrac{\dfrac{v_u-v_v}{E_d}}{2}$ |

FIG. 14

| | V0 | V1 | V2 | V3 | V4 | V5 | V6 | V7 |
|---|---|---|---|---|---|---|---|---|
| U | 0 | 1 | 1 | 0 | 0 | 0 | 1 | 1 |
| V | 0 | 0 | 1 | 1 | 1 | 0 | 0 | 1 |
| W | 0 | 0 | 0 | 0 | 1 | 1 | 1 | 1 |
| VU | -Ed/2 | Ed/2 | Ed/2 | -Ed/2 | -Ed/2 | -Ed/2 | Ed/2 | Ed/2 |
| VV | -Ed/2 | -Ed/2 | Ed/2 | Ed/2 | Ed/2 | -Ed/2 | -Ed/2 | Ed/2 |
| VW | -Ed/2 | -Ed/2 | -Ed/2 | -Ed/2 | Ed/2 | Ed/2 | Ed/2 | Ed/2 |
| Vαβ | 0 | $\sqrt{\frac{2}{3}}E_d e^{j0}$ | $\sqrt{\frac{2}{3}}E_d e^{j\frac{\pi}{3}}$ | $\sqrt{\frac{2}{3}}E_d e^{j\frac{2\pi}{3}}$ | $\sqrt{\frac{2}{3}}E_d e^{j\pi}$ | $\sqrt{\frac{2}{3}}E_d e^{j\frac{4\pi}{3}}$ | $\sqrt{\frac{2}{3}}E_d e^{j\frac{5\pi}{3}}$ | 0 |

FIG. 22

120 DEG VOLTAGE VECTOR RATIO

| VEC / SEC | V0 | V1 | V2 | V3 | V4 | V5 | V6 | V7 |
|---|---|---|---|---|---|---|---|---|
| A | $1+\dfrac{3v_w}{E_d}$ | $\dfrac{v_u - v_w}{E_d}$ | 0 | $\dfrac{v_v - v_w}{E_d}$ | 0 | 0 | 0 | 0 |
| B | $1+\dfrac{3v_u}{E_d}$ | 0 | 0 | $\dfrac{v_v - v_u}{E_d}$ | 0 | $\dfrac{v_w - v_u}{E_d}$ | 0 | 0 |
| C | $1+\dfrac{3v_v}{E_d}$ | $\dfrac{v_u - v_v}{E_d}$ | 0 | 0 | 0 | $\dfrac{v_w - v_v}{E_d}$ | 0 | 0 |

FIG. 26

| 120 DEG VOLTAGE VECTOR RATIO |  |  |  |  |  |  |  |  |
|---|---|---|---|---|---|---|---|---|
| SEC \ VEC | V0 | V1 | V2 | V3 | V4 | V5 | V6 | V7 |
| D | 0 | 0 | $\dfrac{v_u - v_w}{E_d}$ | 0 | 0 | 0 | $\dfrac{v_u - v_v}{E_d}$ | $1 - \dfrac{3v_u}{E_d}$ |
| E | 0 | 0 | $\dfrac{v_v - v_w}{E_d}$ | 0 | $\dfrac{v_v - v_u}{E_d}$ | 0 | 0 | $1 - \dfrac{3v_v}{E_d}$ |
| F | 0 | 0 | 0 | 0 | $\dfrac{v_w - v_u}{E_d}$ | 0 | $\dfrac{v_w - v_v}{E_d}$ | $1 - \dfrac{3v_w}{E_d}$ |

CONTROLLER OF ROTATING ELECTRIC MACHINE

CROSS REFERENCE TO RELATED APPLICATION

The present application is based on and claims the benefit of priority of Japanese Patent Application No. 2018-202109, filed on Oct. 26, 2018, the disclosure of which is incorporated herein by reference.

TECHNICAL FIELD

The present disclosure generally relates to a control device, for example, a controller of a rotating electric machine.

BACKGROUND INFORMATION

In the related art, a control device, or a controller is known that controls a rotating electric machine applied to a system, which includes an inverter having switches in upper and lower arms for each of three phases, a synchronous rotating electric machine electrically connected to the inverter, and a shunt resistor. The shunt resistor is electrically connected to only one of the upper and lower arms in each phase.

The control device detects a voltage of each shunt resistor during a period in which an electric current is flowing therein. That is, the control device detects the voltage of the shunt resistor having the electric current flowing therein in such period. The control device sets, based on the detected voltage, a switching mode in each of carrier signal cycles for each of the switches constituting the inverter by pulse width modulation (PWM) using a carrier signal so as to control an amount of the rotating electric machine to an instruction value.

However, in the above-described control device, a current detection timing can be set only once per carrier signal cycle, thus the current detection frequency is low.

SUMMARY

It is an object of the present disclosure to provide a control device, or a controller in short, of a rotating electric machine capable of increasing a frequency of detection of electric current.

BRIEF DESCRIPTION OF THE DRAWINGS

Objects, features, and advantages of the present disclosure will become more apparent from the following detailed description made with reference to the accompanying drawings, in which:

FIG. 3 is a diagram of a relationship between voltage vectors and detectable phase currents;

FIG. 13 is a diagram of the voltage vectors used in the six sections and ratios of appearance times in one modulation cycle of respective voltage vectors;

FIG. 14 is a diagram of a relationship among the voltage vectors, the switching modes of respective phases, the phase instruction voltages and instruction voltage vectors of respective phases;

FIG. 22 is a diagram of the voltage vectors used in the three sections and ratios of appearance times in the one modulation cycle of respective voltage vectors;

FIG. 26 is a diagram of the voltage vectors used in three sections and ratios of appearance times in the one modulation cycle of respective voltage vectors.

DETAILED DESCRIPTION

First Embodiment

Hereinafter, the first embodiment of a control device, for example, a controller, for a rotating electric machine according to the present disclosure is described with reference to the drawings.

Figure 1:
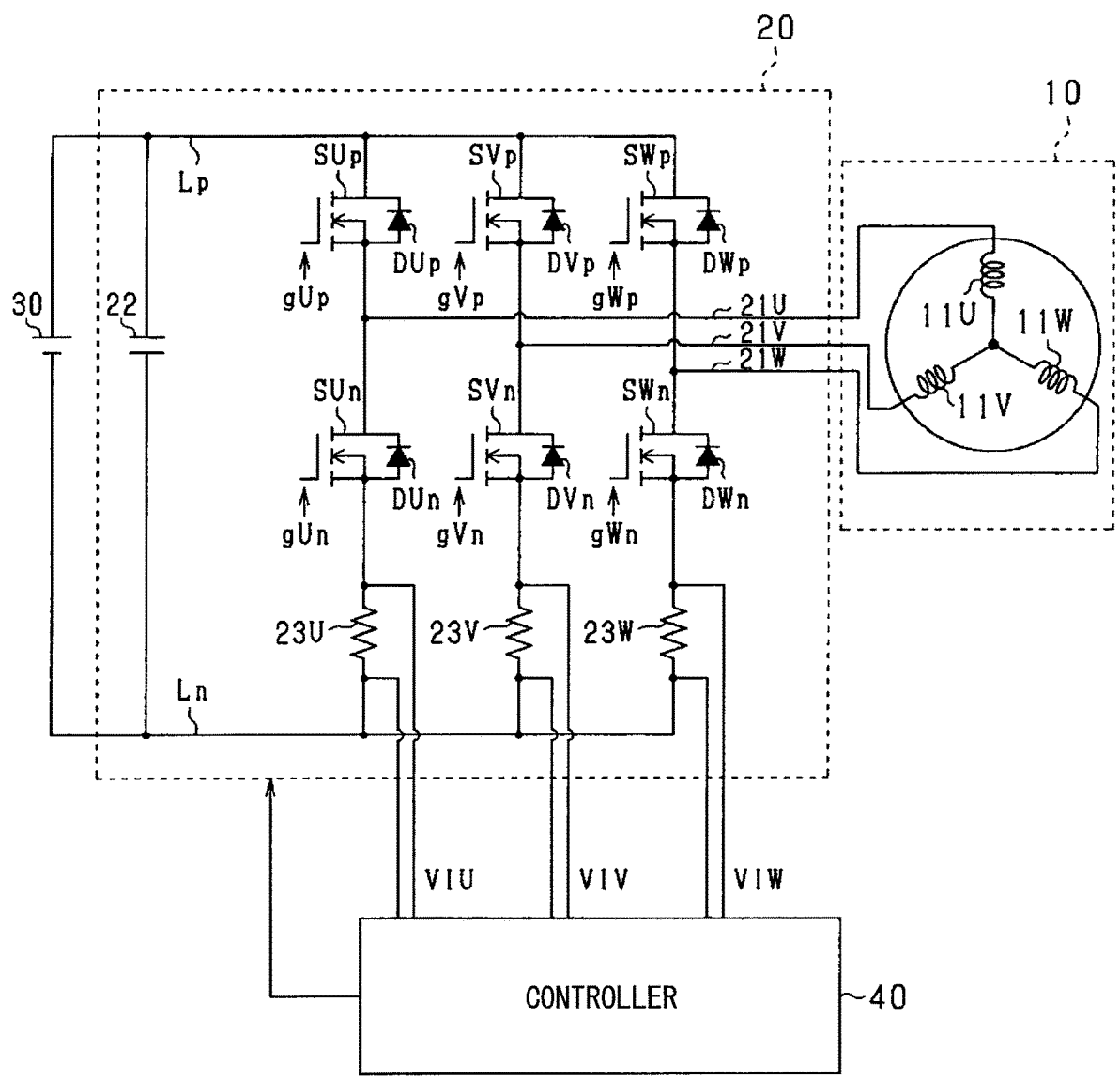
FIG. 1 is a diagram of a configuration of a control system of a rotating electric machine according to a first embodiment of the present disclosure.

As shown in FIG. 1, the control system includes a rotating electric machine 10, an inverter 20, and a controller 40 that controls the rotating electric machine 10. The rotating electric machine 10 is a three-phase synchronous machine. The synchronous machine is, for example, a permanent magnet synchronous machine. In the present embodiment, the rotating electric machine 10 is an interior permanent magnet synchronous motor (IPMSM) of a salient pole machine. The rotating electric machine 10 is used, for example, to drive an in-vehicle accessory. Examples of the in-vehicle accessory include a radiator fan, a blower of an air conditioner, and a water pump.

The inverter 20 is provided with a series connection of upper arm switches SUp, SVp, SWp and lower arm switches SUn, SVn, SWn for three phases. In the present embodiment, voltage-controlled semiconductor switching elements are used as the switches SUp, SUn, SVp, SVn, SWp, and SWn, and more practically, N-channel MOSFETs are used. Therefore, the high potential side terminals of the switches SUp, SUn, SVp, SVn, SWp, and SWn are drains, and the low potential side terminals are sources. The switches SUp, SUn, SVp, SVn, SWp, and SWn have body diodes DUp, DUn, DVp, DVn, DWp, and DWn, respectively.

The source of the U-phase upper arm switch SUp is connected to a first end of a U-phase conductive member 21U such as a bus bar and the drain of the U-phase lower arm switch SUn. A first end of a U-phase winding 11U of the rotating electric machine 10 is connected to a second end of the U-phase conductive member 21U. The source of the V-phase upper arm switch SVp is connected to a first end of a V-phase conductive member 21V such as a bus bar and the drain of the V-phase lower arm switch SVn. A first end of a V-phase winding 11V of the rotating electric machine 10 is connected to a second end of the V-phase conductive member 21V. The source of the W-phase upper arm switch SWp is connected to a first end of a W-phase conductive member 21W such as a bus bar and the drain of the W-phase lower arm switch SWn. A first end of a W-phase winding 11W of the rotating electric machine 10 is connected to a second end of the W-phase conductive member 21W. The second ends of the U, V, W-phase windings 11U, 11V, 11W are connected at a neutral point.

The drains of the U, V, W-phase upper arm switches SUp, SVp, SWp and a positive electrode terminal of a storage battery 30, which is a direct current (DC) power source, are connected by a positive electrode bus line Lp. On the positive electrode bus line Lp, at a position between (i) a connection point to one of the upper arm switches SUp, SVp, SWp which is closest to the positive electrode terminal of the storage battery 30 and (ii) the positive electrode terminal of the storage battery 30, a first end of a smoothing capacitor 22 is connected.

First ends of U, V, W-phase shunt resistors 23U, 23V, 23W are connected to sources of the U, V, W-phase lower arm switches SUn, SVn, SWn. Second ends of the U, V, W-phase shunt resistors 23U, 23V, 23W and a negative electrode terminal of the storage battery 30 are connected by a negative electrode bus line Ln. On the negative electrode bus line Ln, at a position between (i) a connection point to one of the shunt resistors 23U, 23V, 23W which is closest to the negative electrode terminal of the storage battery 30 and (ii) the negative electrode terminal of the storage battery 30, a second end of the smoothing capacitor 22 is connected.

The controller 40 is provided as a microcomputer, in substance, and switches the switches constituting the inverter 20 in order to feedback-control a control amount of the rotating electric machine 10 to an instruction value. In the present embodiment, the control amount is an electric angular velocity, that is, a rotation speed, and the instruction value thereof is an instruction angular velocity $\omega^*$. The controller 40 performs a switching operation of each switch of the inverter 20 such that a voltage vector applied from the inverter 20 to each of the phase windings 11U to 11W becomes an instruction voltage vector for controlling the electric angular velocity to an instruction angular velocity $\omega^*$. In such manner, sinusoidal phase currents which are 120 degrees apart from each other flow to, or through, the phase windings 11U, 11V, 11W.

The controller 40 performs a position sensor-less control, and estimates an electric angle in such control. Position sensor-less control is a control of the rotating electric machine 10 without using rotation angle information of the rotating electric machine 10 detected by an angle sensor such as a Hall element or a resolver.

Note that the controller 40 realizes various control functions by executing a program stored in a storage device, or memory, provided in itself. The various functions may be realized by electronic circuits that are hardware, or may be realized by using both of hardware and software.

Subsequently, the process of the controller 40 is described in detail using the block diagram of FIG. 2.

A speed deviation calculator 41 calculates a speed deviation $\Delta\omega$ by subtracting an estimated angular velocity $\omega$est calculated by a speed estimator 51 described later from the instruction angular velocity $\omega^*$. The estimated angular velocity $\omega$est is an estimated value of the electric angular velocity. The instruction angular velocity $\omega^*$ takes a positive value when rotating the rotor of the rotating electric machine 10 in a specific direction, for example, a forward direction, and takes a negative value when the rotor is rotated in a direction opposite to the specific direction.

A speed controller 42 calculates an instruction torque Trq* of the rotating electric machine 10 as an operation amount for feedback control of the speed deviation $\Delta\omega$ to zero. The instruction torque Trq* has a positive value when rotating the rotor in a specific direction, and has a negative value when rotating the rotor in a direction opposite to the specific direction. Note that, for example, proportional integral control may be used as feedback control in the speed controller 42.

A current converter 43 converts U, V, W-phase currents in a UVW coordinate system, based on an estimated angle $\theta$est calculated by an angle estimator 52 described later and phase currents IU, IV, IW detected by a current detector 53 described later to a $\gamma$ axis current I$\gamma$r and a $\delta$ axis current I$\delta$r in a $\gamma\delta$ coordinate system. The estimated angle $\theta$est is an estimated value of the electric angle. The UVW coordinate system is a three-phase fixed coordinate system of the rotating electric machine 10, and the $\gamma\delta$ coordinate system is a two-phase rotation coordinate system of the rotating electric machine 10. That is, an estimated coordinate system of a dq coordinate system.

An instruction current setter 44 sets a $\gamma$ axis instruction current I$\gamma$* and a $\delta$ axis instruction current I$\delta$* based on the instruction torque Trq*. An instruction current vector in the $\gamma\delta$ coordinate system is determined by the $\gamma$ axis instruction current I$\gamma$* and the $\delta$ axis instruction current I$\delta$*. In the present embodiment, the instruction current setter 44 sets the $\gamma$ axis instruction current I$\gamma$* to zero.

A $\gamma$ axis deviation calculator 45a calculates a $\gamma$ axis deviation $\Delta$I$\gamma$ as a value obtained by subtracting the $\gamma$ axis current I$\gamma$r from the $\gamma$ axis instruction current I$\gamma$*. A $\delta$ axis deviation calculator 45b calculates a $\delta$ axis deviation $\Delta$I$\delta$ as a value obtained by subtracting the δ axis current Iδr from the δ axis instruction current Iδ*.

A current controller 46 calculates a γ axis voltage Vγr as an operation amount for feedback controlling the γ axis current Iγr to the γ axis instruction current Iγ* based on the γ axis deviation ΔIγ. The current controller 46 also calculates a δ axis voltage Vδr as an operation amount for feedback controlling the δ axis current Iδr to the δ axis instruction current Iδ* based on the δ axis deviation ΔIδ. The instruction voltage vector in the γδ coordinate system is determined by the γ axis voltage Vγr and the δ axis voltage Vδr. Note that proportional integral control may be used as feedback control in the current controller 46, for example.

A γ axis superimposer 47a outputs a sum of the γ axis voltage Vγr and a γ axis high frequency voltage Vγh generated by a high frequency wave generator 48 as a γ axis instruction voltage Vγ*. A δ axis superimposer 47b outputs a sum of the δ axis voltage Vδ r and a δ axis high frequency voltage Vδh generated by a high frequency wave generator 48 as a δ axis instruction voltage Vδ*. The high frequency voltages Vγh and Vδh are pulse signals that fluctuate at an angular velocity sufficiently higher than the electric angular velocity of the fundamental wave component of each of the instruction voltages Vγ* and Vδ*, and their amplitude is Va. In the present embodiment, the δ axis high frequency voltage Vδh is set to zero. Therefore, the δ axis voltage Vδr becomes the δ axis instruction voltage Vδ* as it is.

In the present embodiment, the γ axis superimposer 47a, the δ axis superimposer 47b, and the high frequency wave generator 48 correspond to a high frequency applicator.

A voltage converter 49 calculates U, V, W-phase instruction voltages VU, VV, VW that are 120° phase shift with each other in the electric angle based on the γ axis instruction voltage Vγ*, the δ axis instruction voltage Vδ* and the estimated angle θest. In the present embodiment, each of the instruction voltages VU, VV, VW is a sine wave signal.

A signal generator 50 calculates U, V, W-phase instruction time ratios Dtu, Dtv, Dtw, respectively corresponding to the instruction signal, by dividing the U, V, W-phase instruction voltages VU, VV, VW output from the voltage converter 49 by an inter-terminal voltage of the storage battery 30. In the present embodiment, it is assumed that the maximum value of each of the instruction time ratios Dtu, Dtv, Dtw is 1, and the minimum value is 0.

The signal generator 50 generates operation signals gUp, gUn, gVp, gVn, gWp, gWn for the switches SUp, SUn, SVp, SVn, SWp, SWn based on the calculated U, V, W-phase instruction time ratios Dtu, Dtv, Dtw. The operation signal is either an ON instruction or an OFF instruction. The upper arm operation signal and the lower arm operation signal of the same phase do not simultaneously become an ON instruction. The signal generator 50 outputs the generated operation signals gUp to gWn to the switches SUp to SWn that constitute the inverter 20. The switching modes of the switches SUp to SWn are determined by the order of the operation signals gUp to gWn.

The signal generator 50 generates an operation signal by the pulse width modulation (PWM) based on magnitude comparison between the instruction time ratio and a carrier signal SigC in each of the three phases. In the present embodiment, the carrier signal SigC is a triangular wave signal in which the gradual increase rate and the gradual decrease rate are equal. In the present embodiment, the amplitude of the carrier signal SigC is set to one half (½). Therefore, the carrier signal SigC takes a value in the range of 0 to 1, centering on ½.

The speed estimator 51 calculates the estimated angular velocity ωest based on a δ axis high frequency current Iδh that flows along with the application of the γ axis high frequency voltage Vγh. More practically, the speed estimator 51 calculates the estimated angular velocity ωest based on the δ axis high frequency current Iδh that flows as the γ axis high frequency voltage Vγh is switched from a positive voltage (Va) to a negative voltage (−Va), and also calculates the estimated angular velocity ωest based on the δ axis high frequency current Iδh that flows as the γ axis high frequency voltage Vγh is switched from a negative voltage to a positive voltage. For example, the speed estimator 51 may calculate the δ axis high frequency current Iδh by applying a high-pass filter to the δ axis current Iδr.

The angle estimator 52 calculates an estimated angle θest by time-integrating the estimated angular velocity ωest. In the present embodiment, the speed estimator 51 and the angle estimator 52 correspond to a high frequency detector and an estimator.

Subsequently, the current detector 53 is described.

The current detector 53 detects the U, V, W-phase currents IU, IV, IW based on inter-terminal voltages VIU, VIV, VIW of the U, V, W-phase shunt resistors 23U, 23V, 23W. As shown in FIG. 3, in accordance with the voltage vectors V0 to V6, the phase current flows in the shunt resistor during an ON period of the lower arm switch. In the present embodiment, the sign of the voltage across the shunt resistor is defined as positive when the potential of the first end of the shunt resistor is higher than the potential of the second end of the shunt resistor. Further, with regard to the actual phase current, the direction of the phase current flowing from the inverter 20 to the rotating electric machine 10 is defined as positive. Therefore, in the "ARM" column in FIG. 3, a negative sign is attached when the sign of the inter-terminal voltage of the shunt resistor is different from the sign of the actual phase current. Hereinafter, active voltage vectors V1 to V6 are referred to as first to sixth vectors V1 to V6, and reactive voltage vectors V0 and V7 may be referred to as zeroth and seventh vectors V0 and V7.

The signal generator 50 determines whether it is in a non-detector arm ON mode in which all of the U, V, W-phase upper arm operation signals gUp, gVp, gWp among the generated operation signals gUp to gWn are an ON instruction respectively. When it is determined as such a non-detector arm ON mode, the signal generator 50 changes the U, V, W-phase upper arm operation signals gUp, gVp, gWp to the OFF instruction respectively, and changes the U, V, W-phase lower arm operation signals gUn, gVn, gWn to the ON instruction respectively. In the present embodiment, the signal generator 50 corresponds to a setter.

Figure 4:
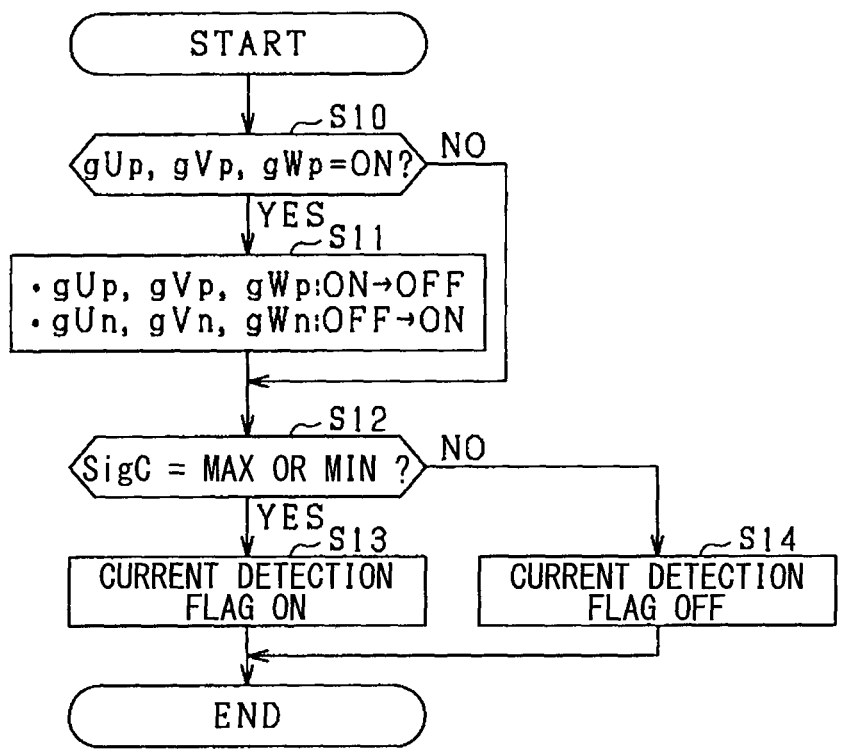
FIG. 4 is a flowchart of a procedure of a change process performed by a signal generator.

A procedure of a process performed by the signal generator 50 is described with reference to FIG. 4. This process is repeatedly performed, for example, in every predetermined control cycle.

At step S10, it is determined whether all of the generated U, V, W-phase upper arm operation signals gUp, gVp, gWp have the ON instruction, respectively.

When it is determined at step S10 that all have the ON instruction, the process proceeds to step S11, where the U, V, W-phase upper arm operation signals gUp, gVp, gWp are switched to the OFF instruction, respectively, and the U, V, W-phase lower arm operation signals gUn, gVn, gWn are switched to the ON instruction, respectively.

When the process of step S11 is complete, or when the negative determination is made at step S10, the process proceeds to step S12. At step S12, it is determined whether the carrier signal SigC is at its maximum value (i.e., 1) or at its minimum value (i.e., 0). This process is a process for determining whether a present control cycle includes electric current detection timing.

When an affirmative determination is made at step S12, it is determined that it is the current detection timing, the process proceeds to step S13, and a current detection flag is turned ON. On the other hand, when a negative determination is made at step S12, it is determined that it is not the current detection timing, the process proceeds to step S14, and the current detection flag is turned OFF.

Figure 5:
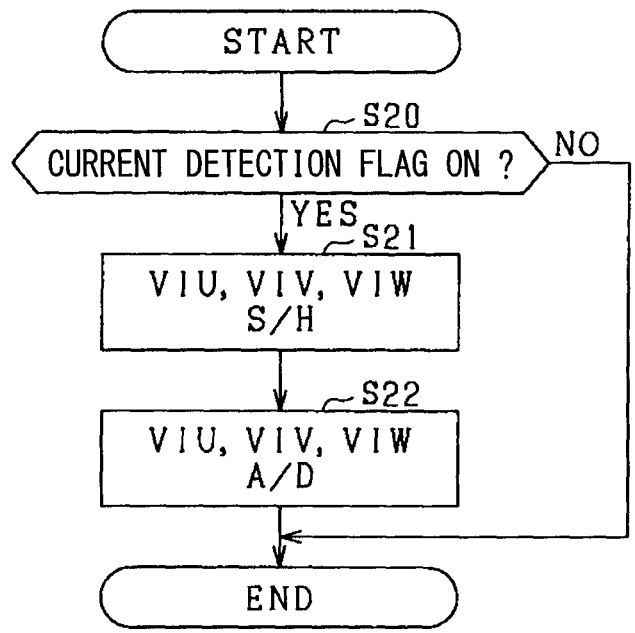
FIG. 5 is a flowchart of a procedure of a current detection process performed by the current detector.

Subsequently, a procedure of a process performed by the current detector 53 is described with reference to FIG. 5. This process is repeatedly performed, for example, in every predetermined control cycle.

At step S20, it is determined whether the current detection flag obtained from the signal generator 50 is ON. This process is a process for determining whether a control cycle includes current detection timing.

When it is determined at step S20 that the current detection flag is ON, the process proceeds to step S21, and the inter-terminal voltages VIU, VIV, VIW of the U, V, W-phase shunt resistors 23U, 23V, 23W are sampled and held, for example, stored in a memory.

At step S22, the inter-terminal voltages VIU, VIV, VIW sampled and held as analog data are converted into digital data. The converted digital data U, V, W-phase currents IU, IV, IW are output to the current converter 43.

Note that the current detector 53 may recognize, without using the current detection flag, the timing at which the carrier signal SigC takes the maximum value or the minimum value as the current detection timing.

Figure 6:
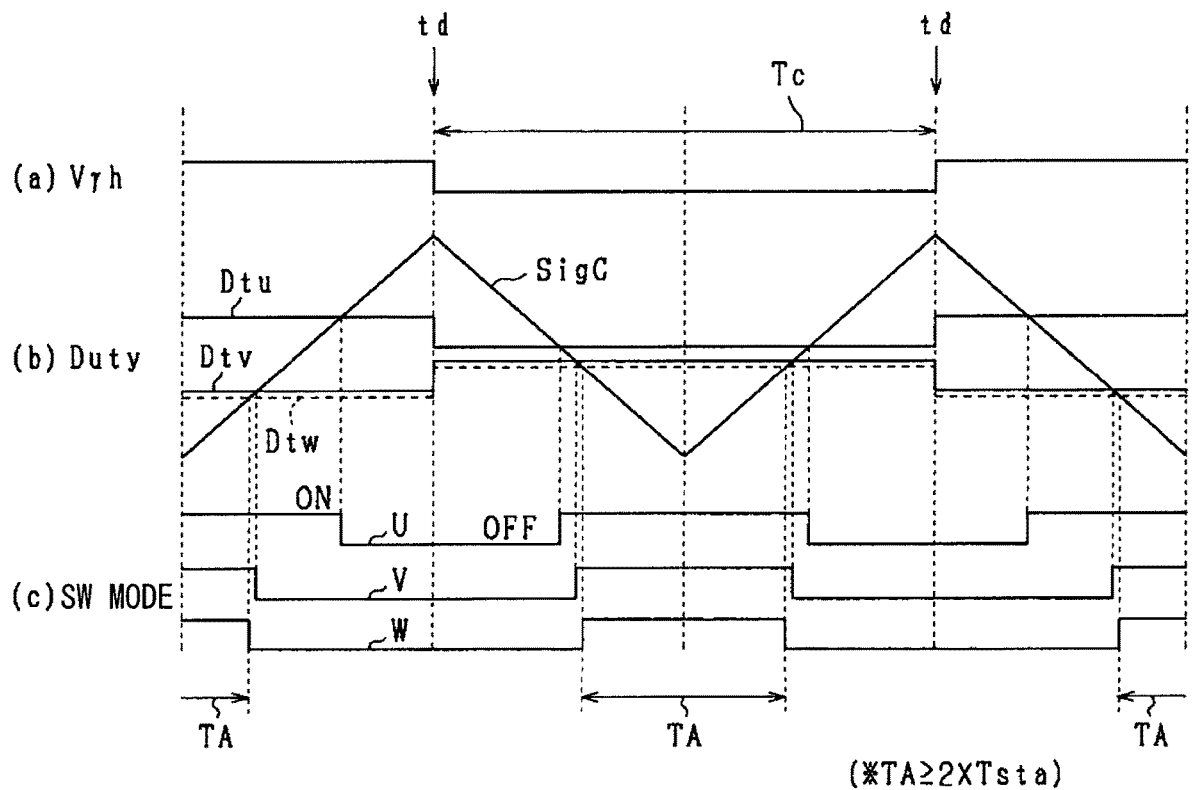
FIG. 6 is a time chart of transition of a high frequency voltage, an instruction time ratio, and a switching mode in a comparative example.
Figure 7:
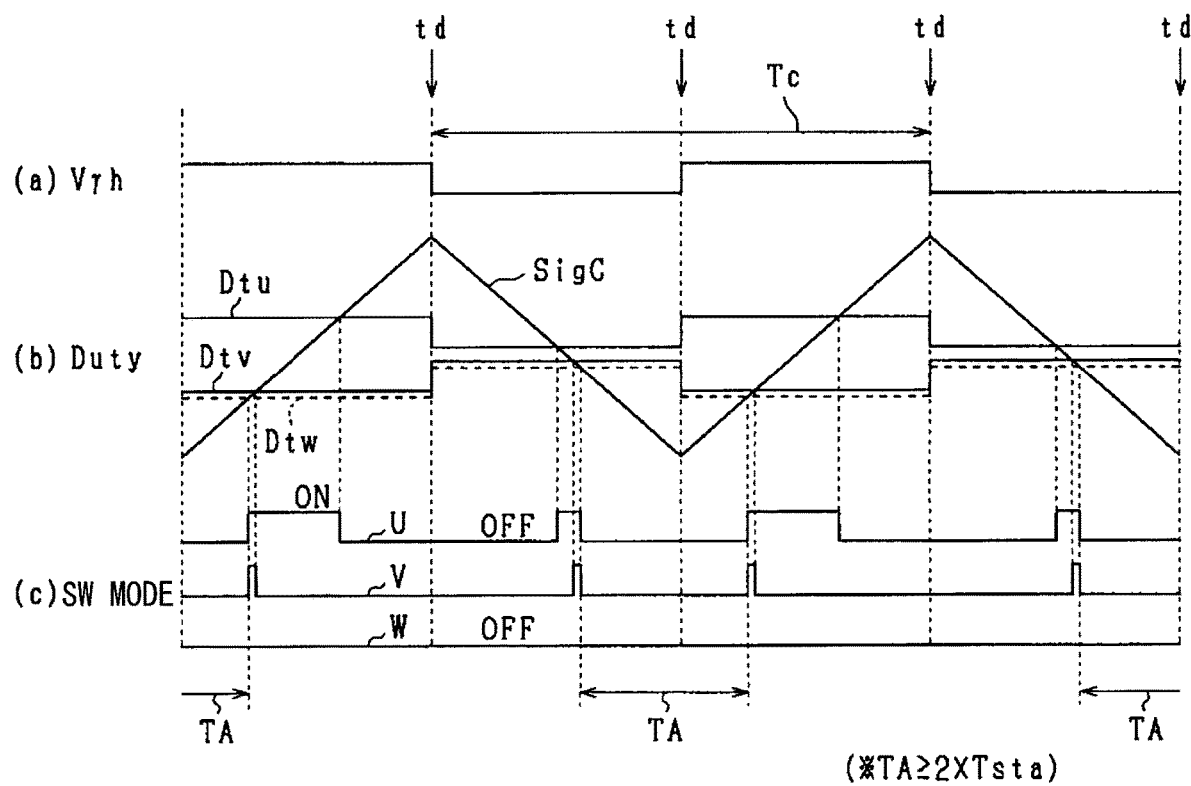
FIG. 7 is a time chart of transition of the high frequency voltage, the instruction time ratio, and the switching mode according to the first embodiment of the present disclosure.

An example of how the operation signal is changed is illustrated using FIG. 6 and FIG. 7. FIG. 6 shows a comparative example in which the operation signal generated by the signal generator 50 is not changed, and FIG. 7 shows an example of the present embodiment in which the generated operation signal is changed.

First, a comparative example shown in FIG. 6 is described. FIG. 6 row (a) shows a transition of the γ axis high frequency voltage Vγh for magnetic pole position estimation, FIG. 6 row (b) shows a transition of respective phase instruction time ratios Dtu, Dtv, Dtw, and FIG. 6 row (c) shows a transition of the switching mode of each of the switches SUp to SWn. Here, in row (a) of FIG. 6, Tc indicates one cycle (corresponding to one modulation cycle) of the carrier signal SigC. Further, in row (c) of FIG. 6, if the U phase is taken as an example, "ON" in FIG. 6 indicates that the U phase upper arm operation signal gUp is an ON instruction and the U phase lower arm operation signal gUn is an OFF instruction. Further, "OFF" in FIG. 6 indicates that the U-phase upper arm operation signal gUp is an OFF instruction and the U-phase lower arm operation signal gUn is an ON instruction.

As shown in FIG. 6, in the comparative example, the timing at which the carrier signal SigC becomes the maximum value is set as a current detection timing td. Therefore, the current detection timing td is set only once in one cycle of the carrier signal SigC. Control of the control amount of the rotating electric machine 10 is performed based on the phase currents IU, IV, IW detected at the current detection timing td, and the estimated angle θest is calculated at such timing. Therefore, the switching cycle of the voltage value of the γ axis high frequency voltage Vγh is set to one cycle of the carrier signal SigC. That is, in other words, one cycle of the γ axis high frequency voltage Vγh is set to two cycles of the carrier signal SigC. In such manner, a frequency (e.g., 10 kHz) of the γ axis high frequency voltage Vγh is included in the human audible frequency range (e.g., 20 Hz to 20 kHz), which may cause unpleasant noise to the user of the system.

Subsequently, the present embodiment is described with reference to FIG. 7. FIG. 7 with row (a) to row (c) correspond to FIG. 6 with row (a) to row (c) described above.

In the present embodiment, the U, V, W-phase upper arm operation signals gUp, gVp, gWp are all switched to the OFF instruction in a period TA during which all of the U, V, W-phase instruction time ratios Dtu, Dtv and Dtw become greater than the carrier signal SigC, and the U, V, W-phase lower arm operation signals gUn, gVn, gWn are all switched to the ON instruction in the period TA. Therefore, the period TA described above is a period of the zeroth vector V0, and electric currents for three phases become detectable. In such manner, each of (i) the maximum timing which is when the carrier signal SigC takes the maximum value, and (ii) the minimum timing which is when the carrier signal SigC takes the minimum value, can be settable as the current detection timing td, and two current detection timings td can be set within one cycle of the carrier signal SigC. Then, by performing the control of FIG. 2 in synchronization with each of the current detection timings td, responsiveness to the control of the rotating electric machine 10 by the control amount is improvable. During the control described above, even when the operation signal is changed as described above, a line voltage of each phase does not change before and after the change of the operation signal in the period TA. Therefore, the influence of the change of the operation signal on the control of the rotating electric machine 10 by the control amount is reducible. Note that, by setting the max/min timing at which the carrier signal SigC takes the maximum value or the minimum value to the current detection timing td, the electric current is detectable at the center of fluctuation of the phase current including a ripple component.

Further, since two current detection timings td are set in one cycle of the carrier signal SigC, one cycle of the γ axis high frequency voltage Vγh can be set as one cycle of the carrier signal SigC. In such manner, the frequency of the γ axis high frequency voltage Vγh can be brought to an outside of the human audible frequency range. In such case, the detection timing of the δ axis high frequency current Iδh and the calculation timing of the estimated angle θest are synchronized with the current detection timing td.

Further, in the present embodiment, the period TA is set as a twofold duration or more of a period Tsta, that is, a ringing convergence period, from the switching of the switching modes to the convergence of the ringing of the electric current flowing in the shunt resistor accompanying the switching of the switching modes. More practically, by setting "TA≥2×Tsta," the ringing converges before the current detection timing td is reached after the start timing of the period TA. Thereby, the detection accuracy of the phase current is improvable.

When a reactive voltage vector period is set to be too short, the ringing described above does not converge within such a period, and the detection accuracy of the phase current may deteriorate. Therefore, in the present embodiment, a period during which the U, V, W-phase instruction time ratios Dtu, Dtv, Dtw become smaller than the carrier signal SigC and a period during which the U, V, W-phase instruction time ratios Dtu, Dtv, Dtw become greater than the carrier signal SigC are equated. Thus, in each cycle of the carrier signal SigC, the current detection timing td is settable in a period in which the ringing has already converged. In such manner, the detection accuracy of the phase current is improvable.

Modification 1 of the First Embodiment

Figure 8:
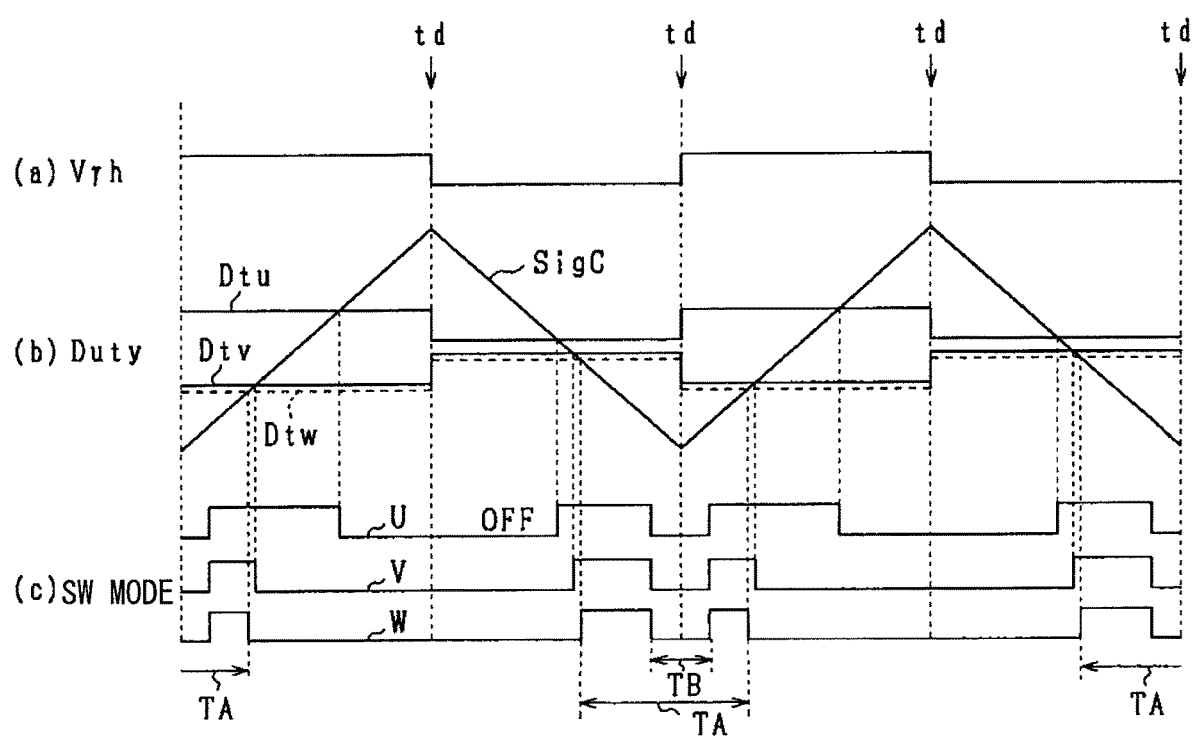
FIG. 8 is a time chart of transition of the high frequency voltage, the instruction time ratio, and the switching mode according to a first modification of the first embodiment of the present disclosure.

As shown in FIG. 8, during a partial period TB, which is part of the period TA having part of the non-detector arm ON period described above, including the timing at which the carrier signal SigC has the minimum value, the U, V, W-phase upper arm operation signals gUp, gVp, gWp may be switched to the OFF instruction, and the U, V, W-phase lower arm operation signals gUn, gVn, gWn may be switched to the ON instruction. FIG. 8 corresponds to FIG. 7 described above.

Modification 2 of the First Embodiment

The position of the U-phase shunt resistor 23U is not limited to the one shown in FIG. 1. That is, the U-phase shunt resistor 23U may be, for example, disposed at a position between the drain of the U-phase lower arm switch SUn and the first end of the U-phase conductive member 21U. The same applies to the V-phase shunt resistor 23V and the W-phase shunt resistor 23W.

Modification 3 of the First Embodiment

Figure 9:
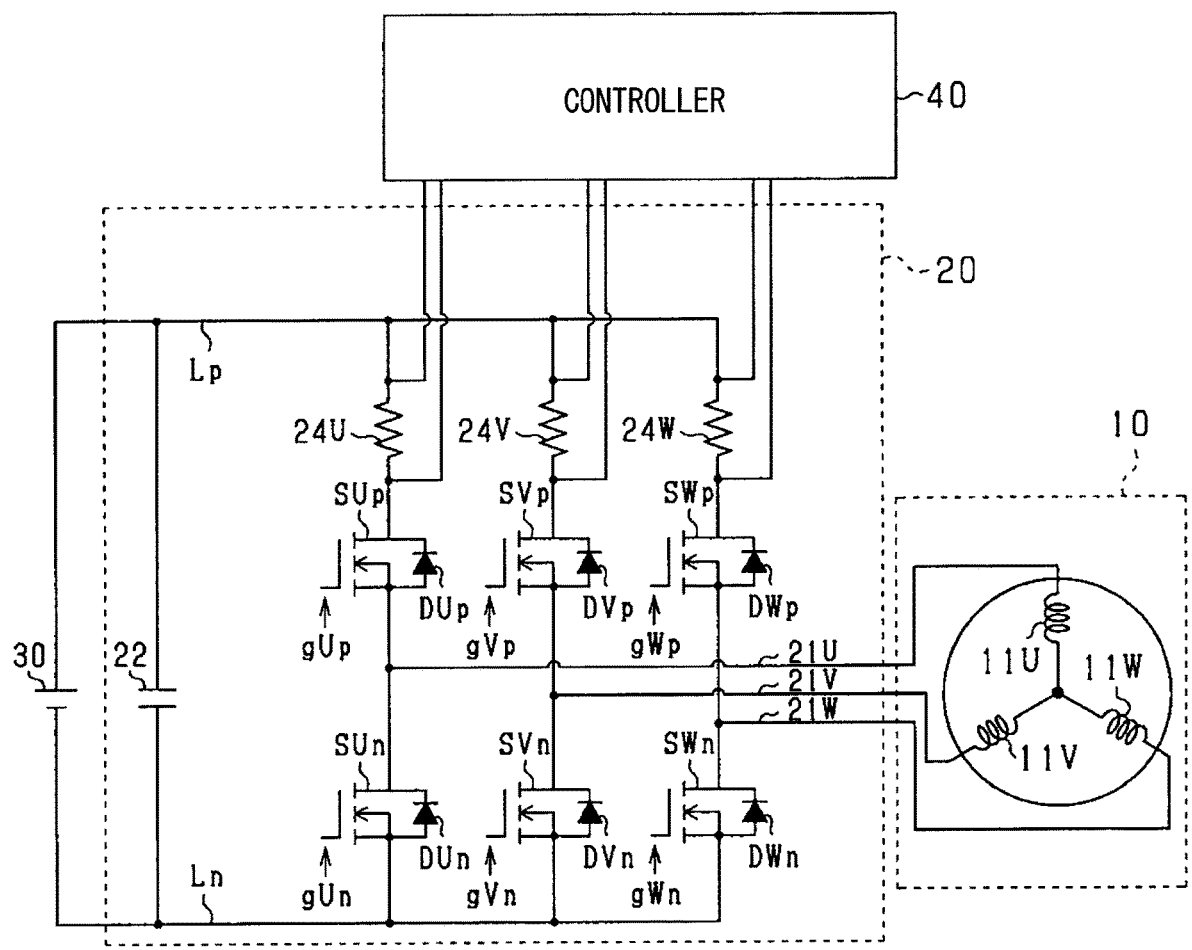
FIG. 9 is a diagram of a configuration of the control system according to a third modification of the first embodiment of the present disclosure.

As shown in FIG. 9, a shunt resistor may be provided on the upper arm side. In FIG. 9, the same components as those already shown in FIG. 1 have the same reference numerals for the sake of convenience. First ends of U, V, W-phase shunt resistors 24U, 24V, 24W are respectively connected to drains of the U, V, W-phase upper arm switches SUp, SVp, SWp. Second ends of the U, V, W-phase shunt resistors 24U, 24V, 24W and the positive electrode terminal of the storage battery 30 are connected by the positive electrode bus line Lp.

Figures 10, 11:
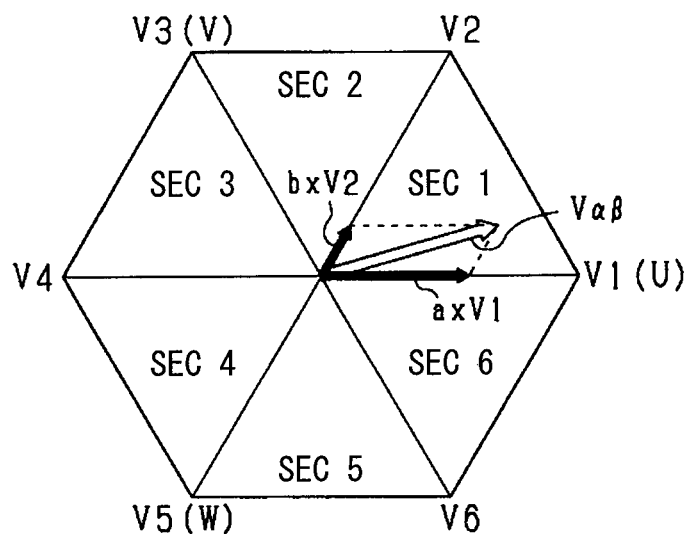
FIG. 10 is a diagram of a relationship between the voltage vectors and the detectable phase currents according to the third modification of the first embodiment of the present disclosure.
FIG. 11 is a diagram of a space vector divided into six sections corresponding to 60-degree voltage vectors according to a second embodiment of the present disclosure.

In the present embodiment, as shown in FIG. 10, the phase current flows in the shunt resistor during the ON period of the upper arm switch according to the voltage vectors V1 to V7. Therefore, the process of step S10 in FIG. 4 is replaced with a process of determining whether all of the generated U, V, W-phase lower arm operation signals gUn, gVn, gWn are the ON instruction. Further, the process of step S11 in FIG. 4 is replaced with a process of (i) switching the U, V, W-phase lower arm operation signals gUn, gVn, gWn to the OFF instruction and (ii) switching the U, V, W-phase upper arm operation signals gUp, gVp, gWp to the ON instruction.

Note that the position of the U-phase shunt resistor 24U is not limited to the one shown in FIG. 9. That is, the U-phase shunt resistor may be, for example, disposed at a position between the source of the U-phase upper arm switch SUp and the first end of the U-phase conductive member 21U. The same applies to the V-phase shunt resistor 24V and the W-phase shunt resistor 24W.

Second Embodiment

Hereinafter, the second embodiment is described focusing on differences from the first embodiment with reference to the drawings. In the present embodiment, space vector modulation (SVM) is used instead of PWM.

Figure 2:
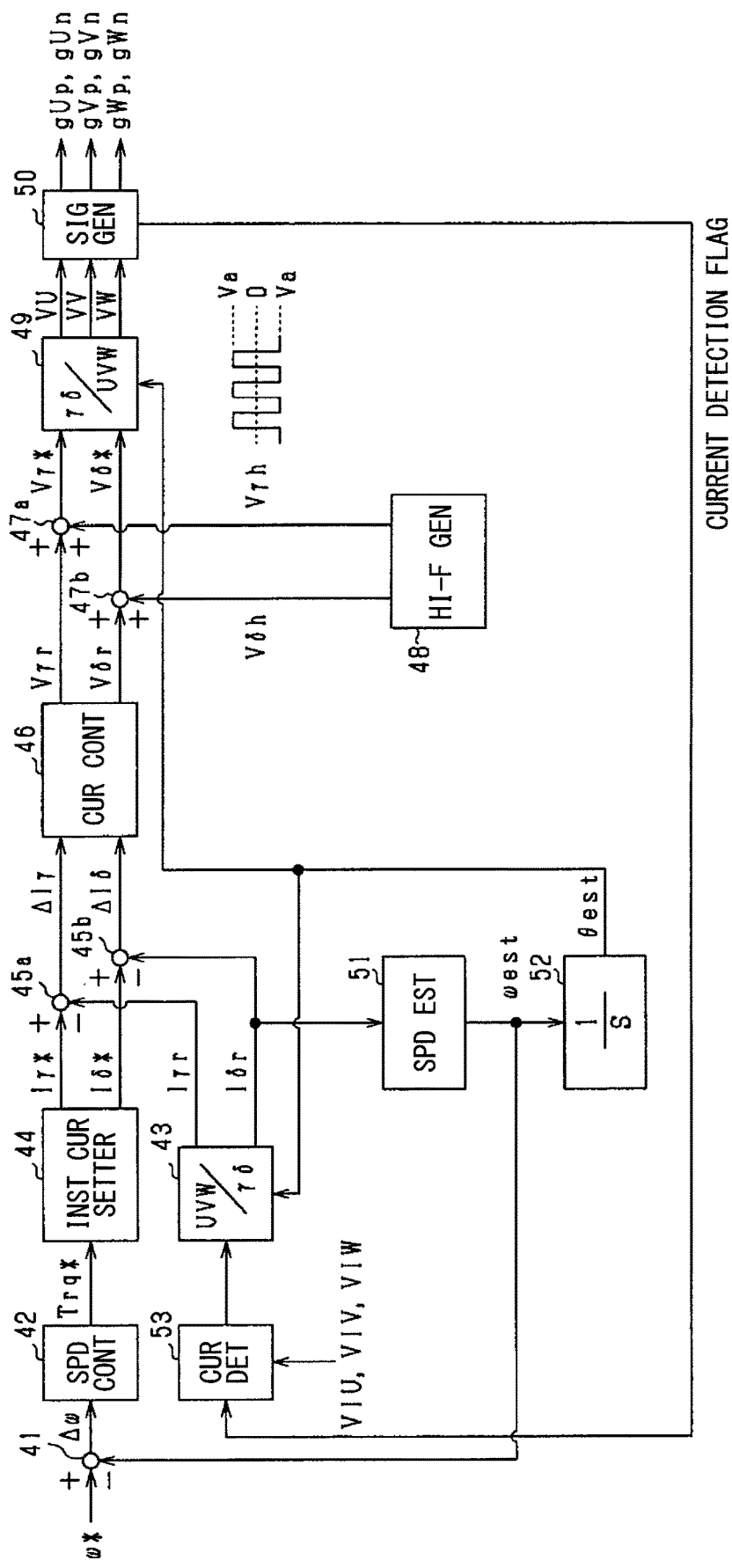
FIG. 2 is a block diagram of a process of a control device.

The process regarding space vector modulation performed by the signal generator 50 of FIG. 2 is described.

Figure 12:
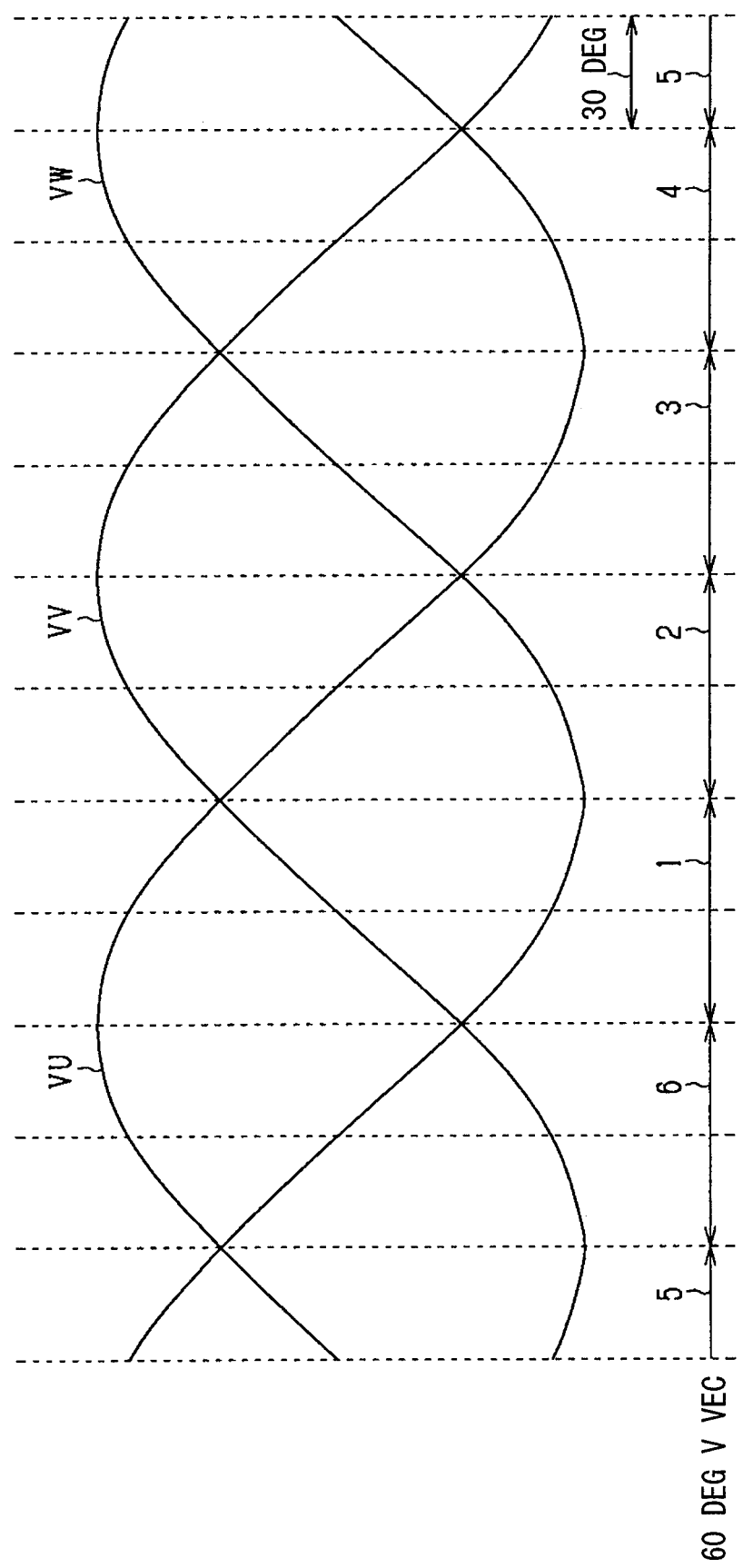
FIG. 12 is a diagram of correspondence between sections and phase instruction voltages.

FIG. 11 shows a hexagonal space vector. In the present embodiment, this space vector is divided into six sections 1 to 6 arranged with a phase difference of 60 degrees. The signal generator 50 determines to which section the instruction voltage vector Vαβ belongs, based on the instruction voltages VU, VV, and VW output from the voltage converter 49. Here, to which section the instruction voltage vector Vαβ belongs is determined based on the magnitude relationship of each of the instruction voltages VU, VV, VW, as shown in FIG. 12.

After a section to which the instruction voltage vector Vαβ belongs is determined, the signal generator 50 selects (i) two types of active voltage vectors and (ii) reactive voltage vectors, as shown in FIG. 13. The two types of active voltage vectors are voltage vectors having a phase difference of 60 degrees with respect to and on both sides of the instruction voltage vector Vαβ. For example, when the instruction voltage vector Vαβ belongs to the section 1, the first and second voltage vectors V1 and V2 and the 0th and seventh voltage vectors V0 and V7 are selected as voltage vectors used for control.

The signal generator 50 arranges in order the selected voltage vectors for each modulation cycle. The switching mode is determined by the arranged-in-order voltage vectors. Here, a period occupied by each of the selected voltage vectors in one modulation cycle Tsw is a value obtained by multiplying one modulation cycle Tsw by the time ratio shown in FIG. 13. The time ratio corresponding to each of the selected voltage vectors is updated based on the calculated instruction voltages VU, VV, VW everytime the U, V, W-phase instruction voltages VU, VV, VW are calculated by the voltage converter 49. The update timing is in synchronization with the current detection timing td.

Subsequently, the determination of the time ratio as shown in FIG. 13 is further described with reference to FIG. 14. In FIG. 14, 1 in the rows of U, V, W indicates that the upper arm switch is turned ON and the lower arm switch is turned OFF, and 0 indicates that the lower arm switch is turned ON and the upper arm switch is turned OFF. Further, FIG. 14 shows the U, V, W-phase instruction voltages VU, VV, VW respectively corresponding to the voltage vectors V0 to V7. Ed/2 corresponds to the voltage of the positive electrode terminal of the storage battery 30, and −Ed/2 corresponds to the voltage of the negative electrode terminal of the storage battery 30, i.e., zero (0).

The instruction voltage vector Vαβ is defined according to the following equation (Equation 1). In the following equation (Equation 1), j is an imaginary number.

$$V_{\alpha\beta} = \sqrt{\frac{2}{3}} \left( V_u \cdot e^{j \cdot 0} + V_v \cdot e^{j \cdot \frac{2\pi}{3}} + V_w \cdot e^{j \cdot \frac{4\pi}{3}} \right) \quad \text{(Equation 1)}$$

As shown in FIG. 11, six sections 1 to 6 are sectioned by six types of active voltage vectors which are disposed at intervals of 60 degrees. An example of the instruction voltage vector Vαβ belonging to the section 1 is described in the following. In this case, the space vector is represented by the following equation (Equation 2) using the respective phase instruction voltages VU, VV, VW based on the above equation (Equation 1).

$$V_{\alpha\beta} = \sqrt{\frac{2}{3}} \left\{ V_u \cdot e^{j \cdot 0} - V_v \left( e^{j \cdot 0} + e^{j \cdot \frac{4\pi}{3}} \right) + V_w \cdot e^{j \cdot \frac{4\pi}{3}} \right\} \quad \text{(Equation 2)}$$

$$= \sqrt{\frac{2}{3}} \left\{ (V_u - V_v) e^{j \cdot 0} + (V_v - V_w) e^{j\frac{\pi}{3}} \right\}$$

On the other hand, by using the instantaneous space vector shown in FIG. 14, the instruction voltage vector Vαβ is represented by the following equation (Equation 3). In the following equation (equation 3), a and b are coefficients.

$$V_{\alpha\beta} = a \cdot V_1 + b \cdot V_2 = \sqrt{\frac{2}{3}} E_d \left( a \cdot e^{j \cdot 0} + b \cdot e^{j\frac{\pi}{3}} \right) \quad \text{(Equation 3)}$$

The coefficients a and b can be represented by the following equation (Equation 4) by comparing the right sides of the above equations (Equation 2) and (Equation 3).

$$a = \frac{V_u - V_v}{E_d}, \quad b = \frac{V_v - V_w}{E_d} \quad \text{(Equation 4)}$$

Thereby, as shown in FIG. 13, in case of having the instruction voltage vector Vαβ in section 1, the time ratio of the first and second voltage vectors V1 and V2 in one modulation cycle Tsw is determined. The time ratio of the reactive voltage vector is also determined by this time ratio and one modulation cycle Tsw. Similarly, the time ratios of the active and reactive voltage vectors are determined for sections 2 to 6 as well.

Note that, in FIG. 13, the time ratio of the two types of reactive voltage vectors V0 and V7 may be not equated with each other. For example, in order to reduce the number of switching times, only one of two types of reactive voltage vectors V0 and V7 may be used.

The signal generator 50, upon determining that the seventh vector V7 is included in the selected reactive voltage vector, changes the seventh vector V7 to the zeroth vector V0. This change is implemented to impose a condition that the electric current flows in the shunt resistors of at least two phases in at least part of one half of one modulation cycle. That is, while the phase current cannot be detected in the period of the seventh vector V7, phase currents of three phases can be detected in the period of the zeroth vector V0. In the present embodiment, the signal generator 50 corresponds to a selector and a changer.

Figure 15:
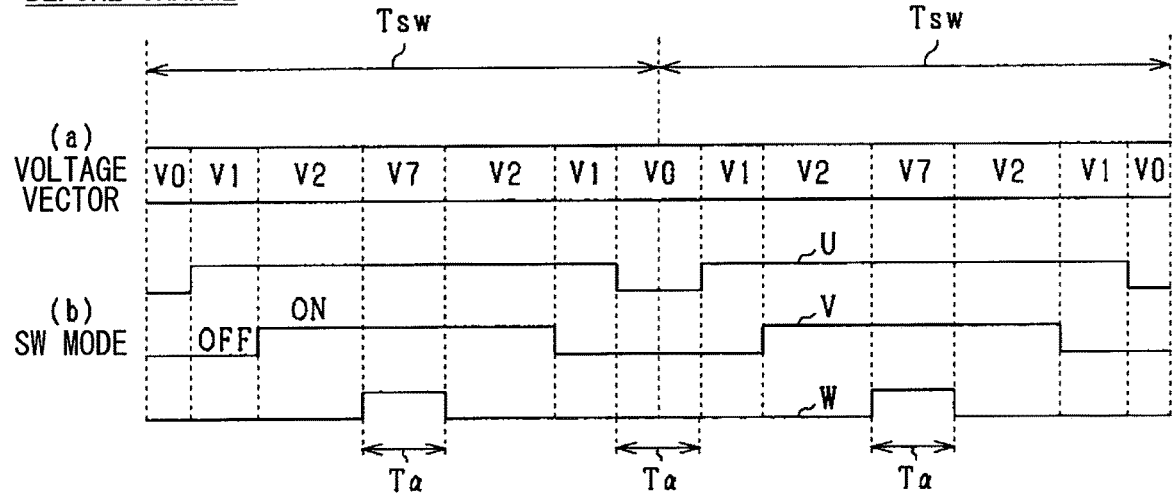
FIG. 15 is a time chart of transitions of the voltage vectors and the switching modes before changing the voltage vector.
Figure 16:
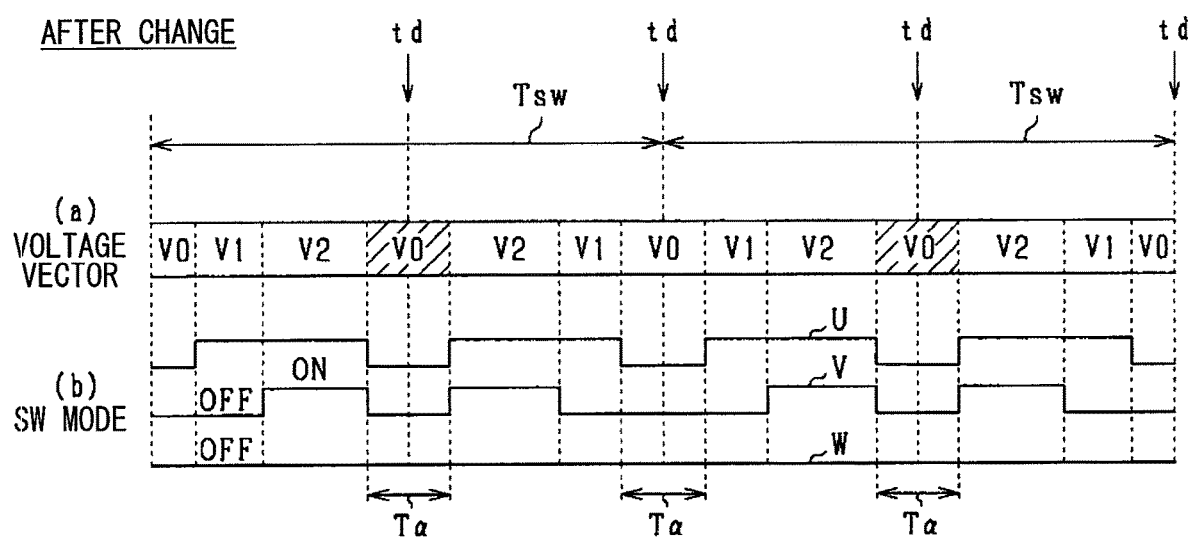
FIG. 16 is a time chart of transitions of the voltage vectors and the switching modes after changing the voltage vector.

An example of how voltage vectors are changed is described using FIG. 15 and FIG. 16. FIG. 15 shows a state before the change of the seventh vector V7 selected by the signal generator 50, and FIG. 16 shows a state after the change of the selected seventh vector V7 to the zeroth vector V0. FIG. 15 shows an example of the instruction voltage vector Vαβ belonging to section 1 and V1, V2, V0, V7 being selected as voltage vectors. Row (a) of FIG. 15 shows a transition of the voltage vector, and row (b) of FIG. 15 shows a transition of the switching mode. In FIG. 15, Tsw indicates one modulation cycle.

Subsequently, FIG. 16 is described. As shown in FIG. 16, the seventh vector V7 is changed to the zeroth vector V0. Thereby, the current detection timing can be set twice within one modulation cycle Tsw.

In the present embodiment, an appearance time Tα of each of a pair of reactive voltage vectors in one modulation cycle Tsw is set to have a twofold duration of the ringing convergence period Tsta, within which a ringing of the electric current flowing in the shunt resistor accompanying a switching of the switching modes converges after the switching of the switching modes. Further, the periods Tα of the pair of the reactive voltage vectors in one modulation cycle Tsw are equal to each other. In such manner, the detection accuracy of the phase current is improvable.

According to the present embodiment described above, the same effects as the first embodiment are achievable.

Modification of Second Embodiment

In FIG. 13, only the seventh vector V7 may be used as the reactive voltage vector. In such case, the setting process of the voltage vector as shown in FIG. 16 is performable without performing the setting process of the voltage vector shown in FIG. 15.

Figure 17:
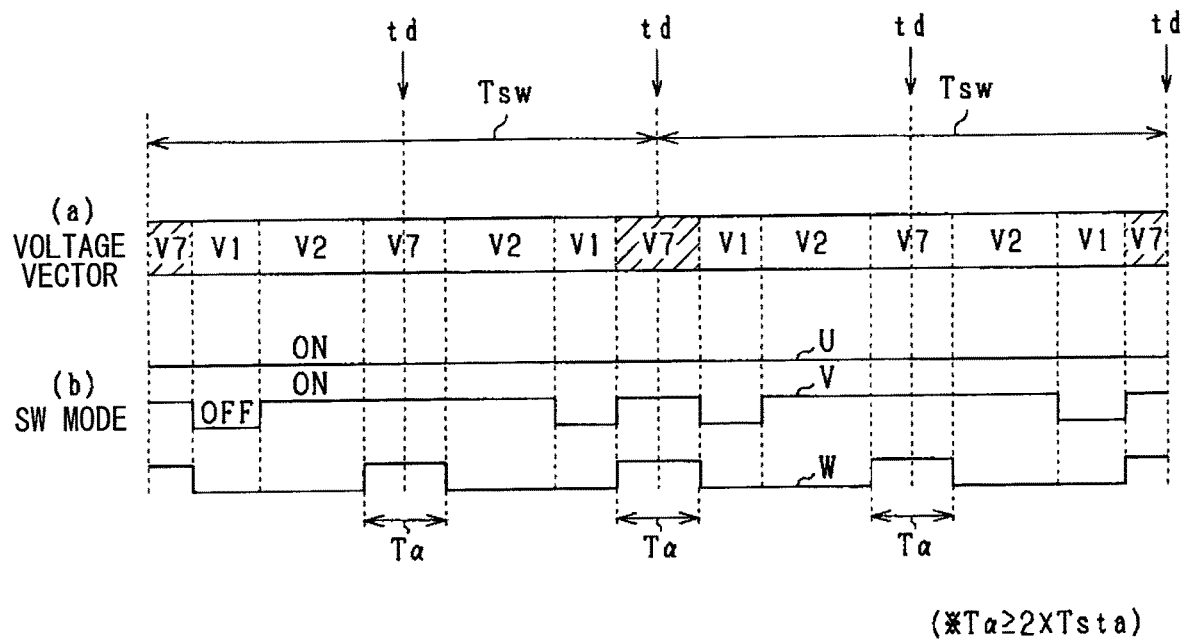
FIG. 17 is a time chart of transition of the voltage vectors and the switching modes according to a modification of the second embodiment of the present disclosure.

In the second embodiment, the shunt resistor may be disposed at a position shown in FIG. 9 of the first embodiment. In this case, the zeroth vector V0 selected as shown in FIG. 15 may be changed to the seventh vector V7 in FIG. 17. Then, the central timing of the period of the seventh vector V7 may be set as the current detection timing td. FIG. 17 corresponds to FIG. 16 described above. Further, the configuration shown in FIG. 17 also has the appearance time Tα of each of the seventh vectors V7 in one modulation cycle Tsw after switching of the switching modes is set to have at least twofold duration of the ringing convergence period Tsta, within which the ringing of the electric current accompanying the switching of the switching modes converges. Further, the periods Tα of the pair of seventh vectors V7 in one modulation cycle Tsw are equal to each other.

Third Embodiment

The third embodiment is described below with reference to the drawings, focusing on the differences from the second embodiment.

In the present embodiment, only the zeroth vector V0 is used as the reactive voltage vector in FIG. 13. The signal generator 50 determines a section to which the instruction voltage vector Vαβ belongs by a method similar to that of the second embodiment, and, based on the determination result, two types of active voltage vectors and a zeroth vector V0 are selected. In the present embodiment, how the selected voltage vectors are arranged is different from that in the second embodiment.

Figure 18:
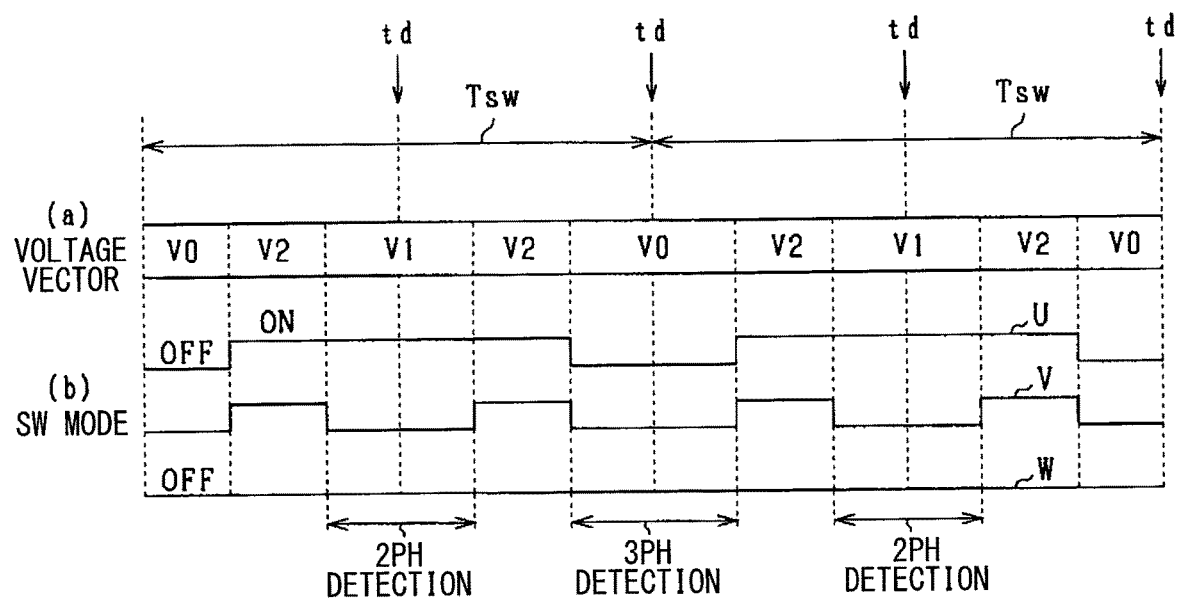
FIG. 18 is a time chart of transition of the voltage vectors and the switching modes according to a third embodiment of the present disclosure.

More practically, the signal generator 50 arranges the operation signals gUp to gWn as the switching mode setting, for the voltage vectors within one modulation cycle to appear in an order of (a) the selected reactive voltage vector, (b) an even-number voltage vector from among the selected active voltage vectors, and (c) an odd-number voltage vector then the even-number voltage vector from among the selected active voltage vectors. FIG. 18 shows an example of the instruction voltage vector Vαβ belonging to section 1. Further, FIG. 18 shows an example in which the zeroth vector V0 is selected as the reactive voltage vector.

For every modulation cycle Tsw, the voltage vectors are arranged in an order of the selected zeroth vector, the selected second vector V2, the selected first vector V1, and the selected second vector V2. In such case, the current detection timing td is set to the central timing of the period of the zeroth vector and to the central timing of the period of the first vector V1. During the period of the first vector V1, phase currents for two phases are detectable. When the phase currents for two phases are detected, the current detector 53 calculates the remaining phase current based on the phase currents for two phases, using the relationship of "IU+IV+IW=0."

In FIG. 18, the appearance time of each of the first vector V1 and the zeroth vector V0 in one modulation cycle Tsw is set to have the twofold duration or more of the above-described period Tsta for the ringing convergence.

According to the present embodiment described above, the same effects as the second embodiment are achievable.

Modification of the Third Embodiment

Figure 19:
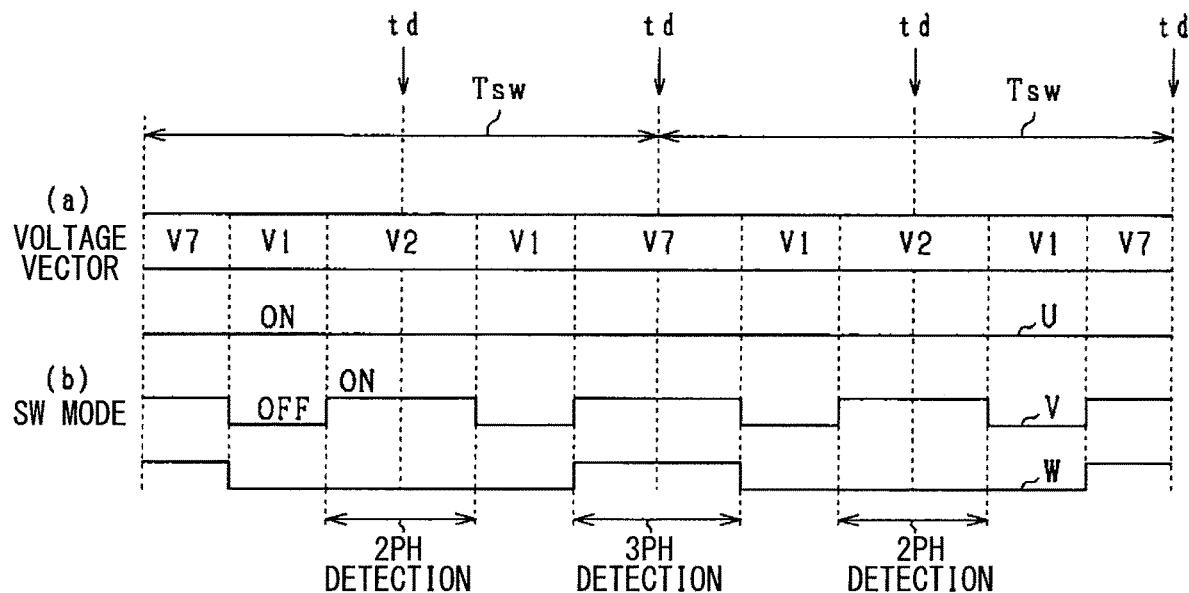
FIG. 19 is a time chart of transition of the voltage vectors and the switching modes according to a modification of the third embodiment of the present disclosure.

In the third embodiment, the shunt resistor may be disposed at a position shown in FIG. 9. In this case, the signal generator 50 sets the switching mode, for the appearance of the voltage vectors within every modulation cycle Tsw in an order of the seventh vector V7, the odd-number voltage vector from among the selected active voltage vectors, and the even-number voltage vector then the odd-number voltage vector from among the selected active voltage vectors. The seventh vector V7 is selected because detection of three phase currents is enabled during the period of the seventh vector. FIG. 19 shows an example of the instruction voltage vector Vαβ belonging to section 1. As shown in FIG. 19, the voltage vectors are arranged in an order of the selected seventh vector, the selected first vector V1, the selected second vector V2 and the selected first vector V1 within every modulation cycle Tsw.

In FIG. 19, the appearance time of each of the second vector V2 and the seventh vector V7 in one modulation cycle Tsw is set to have a twofold duration or more than the above-described period Tsta of ringing convergence.

Fourth Embodiment

The fourth embodiment is described below with reference to the drawings, focusing on the differences from the second embodiment. In the present embodiment, a voltage vector with a phase difference of 120 degrees is selected.

The process regarding space vector modulation performed by the signal generator 50 of FIG. 2 is described.

Figure 20:
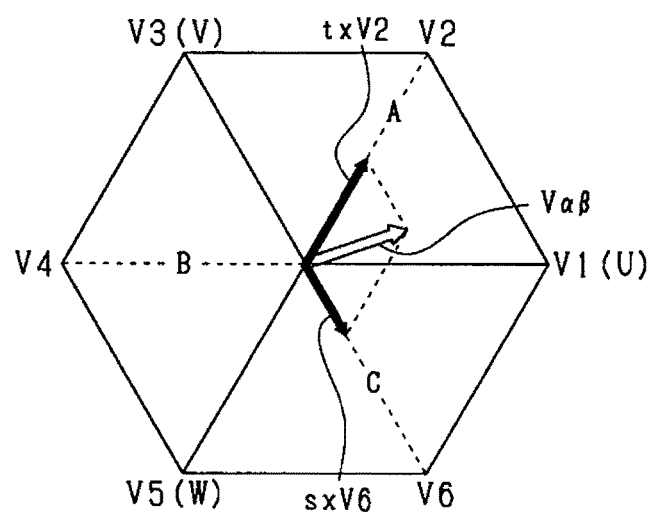
FIG. 20 is a diagram of hexagonal space vectors divided into three sections according to a fourth embodiment of the present disclosure.

FIG. 20 shows a hexagonal voltage vector space. In the present embodiment, three sections A to C are divided by three reference lines respectively shifted by an angle of 120 degrees. A pair of reference lines that define section A sandwich the second vector V2 and respectively have a phase difference of 60 degrees from the second vector V2.

Figure 21:
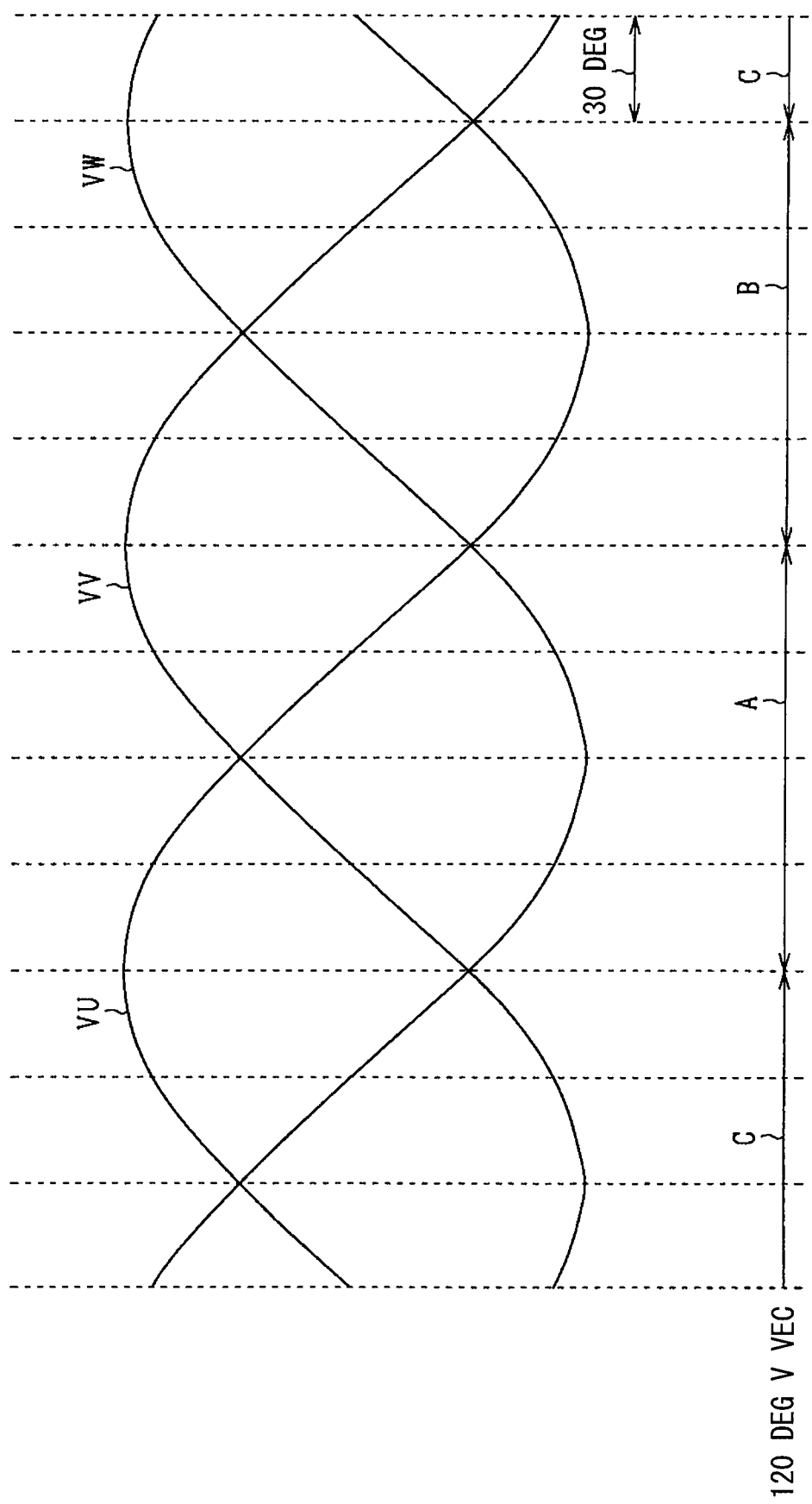
FIG. 21 is a diagram of correspondence between sections and the phase instruction voltages.

The signal generator 50 determines which section the instruction voltage vector Vαβ belongs to, based on the instruction voltages VU, VV, VW output from the voltage converter 49. Here, to which section the instruction voltage vector Vαβ belongs is determined based on the magnitude relationship among the instruction voltages VU, VV, VW, as shown in FIG. 21.

After a section to which the instruction voltage vector Vαβ belongs is determined, the signal generator 50 selects two odd-number voltage vectors and one zero voltage vector, as shown in FIG. 22. The two types of active voltage vectors are voltage vectors sandwiching the instruction voltage vector Vαβ and having a phase difference of 120 degrees with each other. For example, when the instruction voltage vector Vαβ belongs to section A, the first and third vectors V1 and V3 and the zeroth vector V0 are selected as voltage vectors used for control.

The signal generator 50 arranges the selected voltage vectors in order within every modulation cycle Tsw. The switching mode is determined by the arranged-in-order voltage vectors. Here, a period occupied by one modulation cycle Tsw of each selected voltage vector is a value obtained by multiplying one modulation cycle Tsw by the time ratio shown in FIG. 22. The time ratio corresponding to each of the selected voltage vectors is updated based on the calculated instruction voltages VU, VV, VW everytime the U, V, W-phase instruction voltages VU, VV, VW are calculated by the voltage converter 49. The update timing is in synchronization with the current detection timing td.

Subsequently, the determination of the time ratio is described with reference to a diagram in FIG. 22. Here, an example of the instruction voltage vector Vαβ belonging to section A is described. In this case, based on the above equation (Equation 1), the instruction voltage vector Vαβ is represented by the following equation (Equation 5) using the phase voltages VU, VV, VW.

$$V_{\alpha\beta} = \sqrt{\frac{2}{3}} \left\{ V_u e^{j0} + V_v e^{j\frac{2\pi}{3}} - V_w \left( e^{j0} + e^{j\frac{2\pi}{3}} \right) \right\} \quad \text{(Equation 5)}$$

$$= \sqrt{\frac{2}{3}} \left\{ (V_u - V_w) e^{j0} + (V_v - V_w) e^{j\frac{2\pi}{3}} \right\}$$

On the other hand, using the instantaneous space vector shown in FIG. 14, the instruction voltage vector Vαβ is represented by the following equation (Equation 6). In the following equation (Equation 6), s and t are coefficients.

$$V_{\alpha\beta} = s \cdot V_1 + t \cdot V_3 \quad \text{(Equation 6)}$$

$$= \sqrt{\frac{2}{3}} E_d \left( s \cdot e^{j0} + t \cdot e^{j\frac{2\pi}{3}} \right)$$

The coefficients s and t can be represented by the following equation (Equation 7) by comparing the right sides of the above equations (Equation 5) and (Equation 6).

$$s = \frac{V_u - V_w}{E_d}, \quad t = \frac{V_v - V_w}{E_d} \quad \text{(Equation 7)}$$

Thereby, as shown in FIG. 22, in case of the section A, the time ratio of the first and third vectors V1 and V3 in one modulation cycle Tsw is determined. The time ratio of the reactive voltage vector is also determined by this time ratio and one modulation cycle Tsw. Similarly, the time ratio of the active voltage vector is determined for sections B and C as well.

The signal generator 50 sets the switching mode by arranging the operation signals gUp to gWn, for the voltage vectors within one modulation cycle Tsw to appear in an order of the selected reactive voltage vector, the odd-number voltage vector having a shorter appearance time from among the selected active voltage vectors, the odd-number voltage vector having a longer appearance time from among the selected active voltage vectors, and the odd-number voltage vector having the shorter appearance time.

Figure 23:
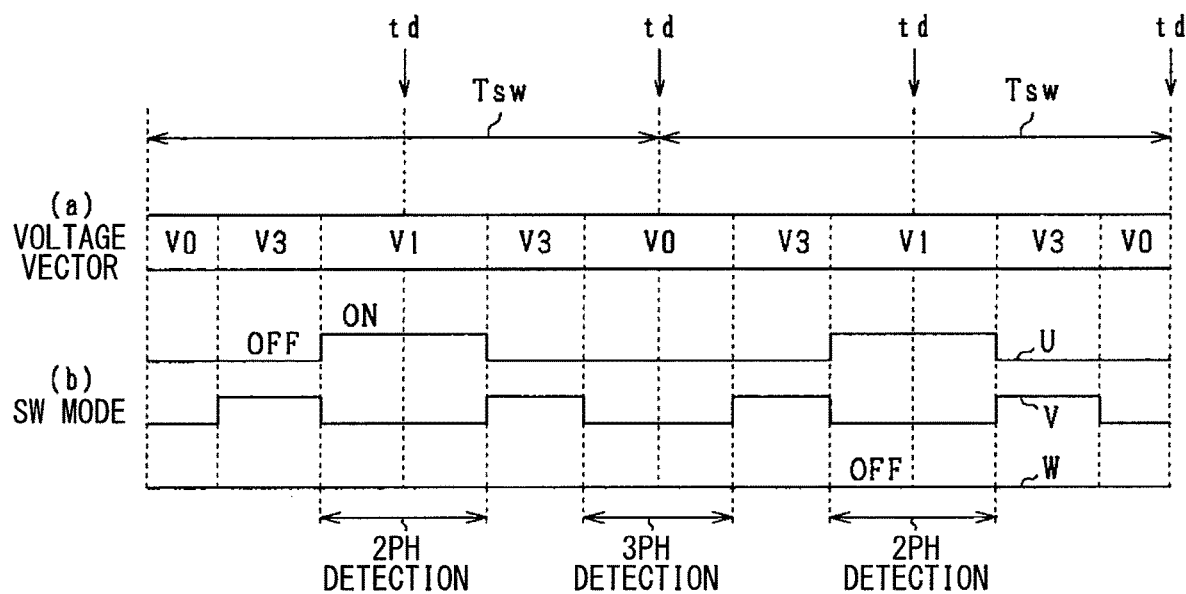
FIG. 23 is a time chart of transition of the voltage vectors and the switching modes.

FIG. 23 shows an example of the instruction voltage vector Vαβ belonging to section A. For every modulation cycle Tsw, the voltage vectors are arranged in an order of the selected zeroth vector, the selected third vector V3, the selected first vector V1, and the selected third vector V3. In this case, the current detection timing td is set to the central timing of the period of the zeroth vector and to the central timing of the period of the first vector V1. When the phase currents for two phases are detected, the current detector 53 calculates the remaining phase current based on the phase currents for two phases, using the relationship of "IU+IV+ IW=0."

In FIG. 23, the appearance time of each of the first vector V1 and the zeroth vector V0 in one modulation cycle Tsw is set to have the twofold duration or more than the above-described period Tsta for the ringing convergence.

According to the present embodiment described above, the same effects as the third embodiment are achievable.

Modification of Fourth Embodiment

In the fourth embodiment, the shunt resistor may be disposed at a position shown in FIG. 9. The process of the controller 40 in the modification of the fourth embodiment is described below.

Figure 24:
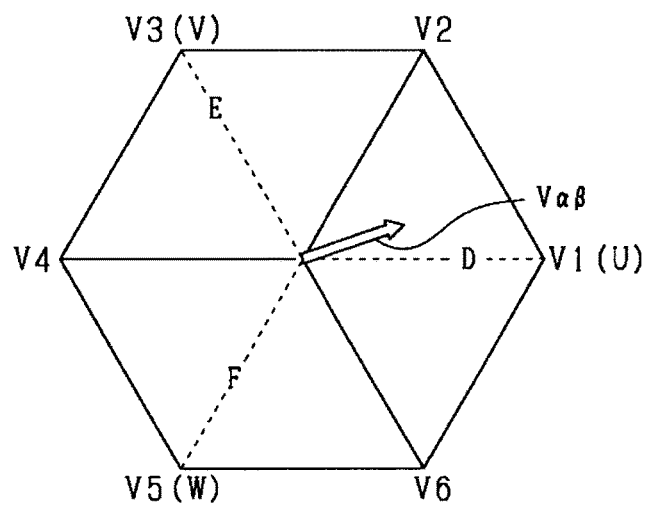
FIG. 24 is a diagram of the hexagonal space vectors divided into three sections according to a modification of the fourth embodiment of the present disclosure.

FIG. 24 shows a hexagonal voltage vector space. In the present embodiment, three sections D to F are divided by three reference lines respectively shifted by an angle of 120 degrees. A pair of reference lines that define section D sandwich the first vector V1 and respectively have a phase difference of 60 degrees from the first vector V1.

Figure 25:
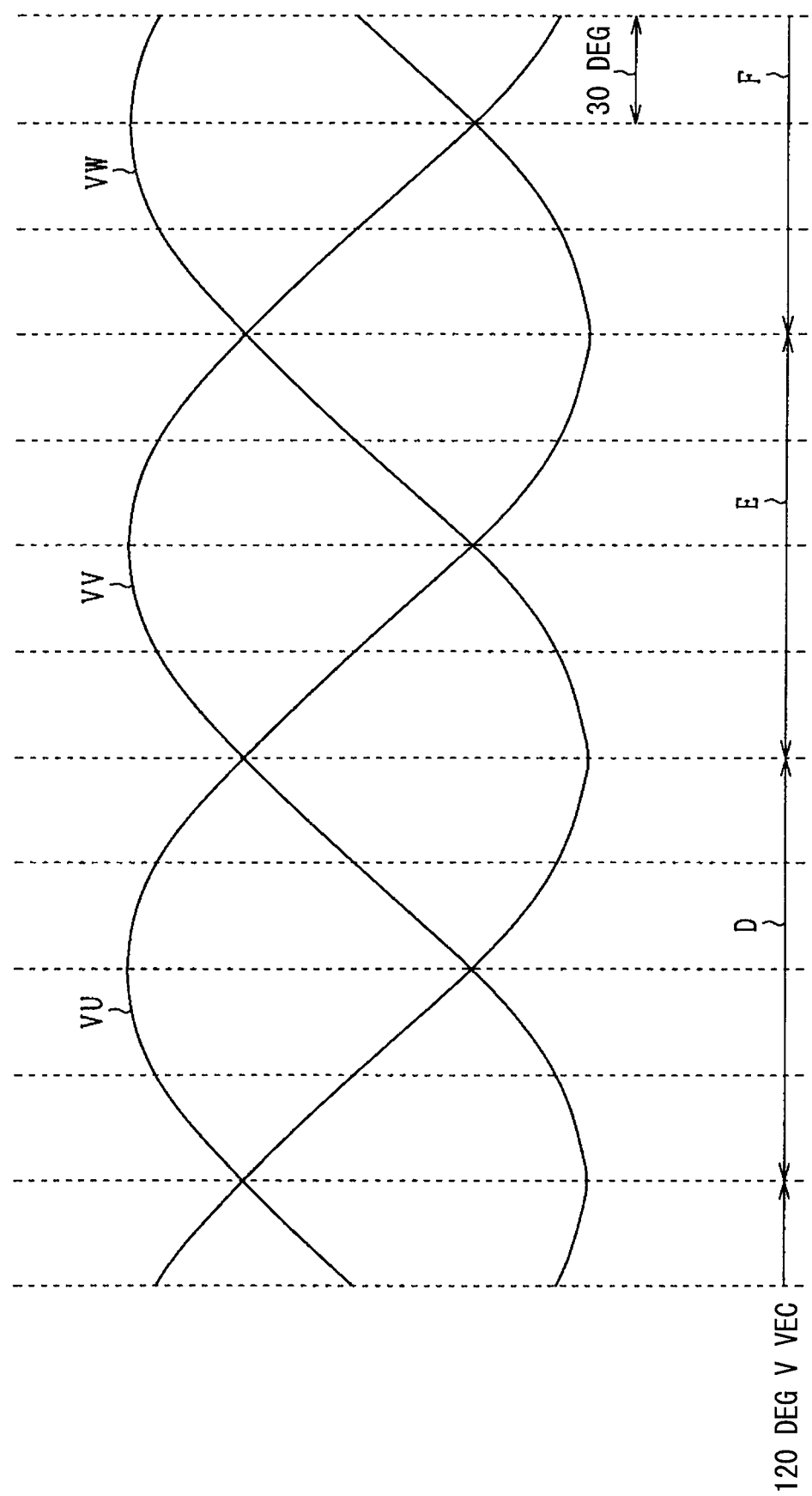
FIG. 25 is a diagram of correspondence between sections and the phase instruction voltages.

The signal generator 50 determines which section the instruction voltage vector V$\alpha\beta$ belongs to, based on the instruction voltages VU, VV, VW output from the voltage converter 49. Here, to which section the instruction voltage vector V$\alpha\beta$ belongs is determined based on the magnitude relationship among the instruction voltages VU, VV, VW, as shown in FIG. 25.

After a section to which the instruction voltage vector V$\alpha\beta$ belongs is determined, the signal generator 50 selects two types of active voltage vectors, that is, two even-number voltage vectors and one zero voltage vector, as shown in FIG. 26. The two types of active voltage vectors are voltage vectors sandwiching the instruction voltage vector V$\alpha\beta$ and having a phase difference of 120 degrees with each other. For example, when the instruction voltage vector V$\alpha\beta$ belongs to section D, the second and sixth vectors V2 and V6 and the seventh vector V7 are selected as voltage vectors used for control.

The signal generator 50 arranges the selected voltage vectors in an order within every modulation cycle Tsw. The switching mode is determined by the arranged-in-order voltage vectors. Here, a period occupied by each of the selected voltage vectors in one modulation cycle Tsw is a value obtained by multiplying one modulation cycle Tsw by the time ratio shown in FIG. 26. The time ratio corresponding to each of the selected voltage vectors is updated based on the calculated instruction voltages VU, VV, VW everytime the U, V, W-phase instruction voltages VU, VV, VW are calculated by the voltage converter 49. The update timing is in synchronization with the current detection timing td.

Figure 27:
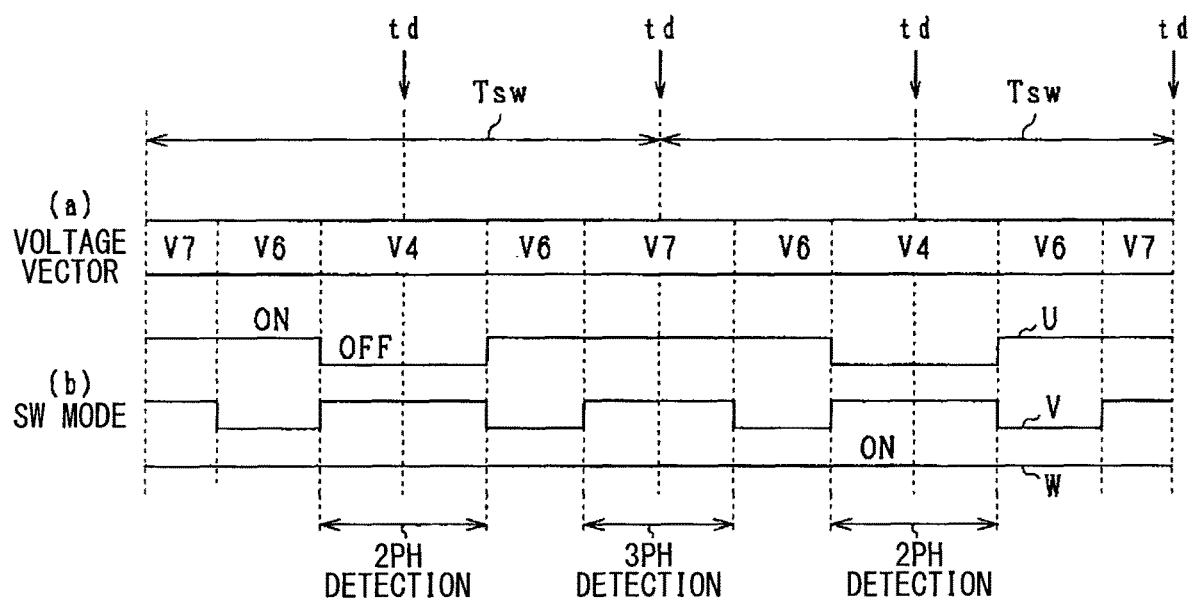
FIG. 27 is a time chart of transition of the voltage vectors and the switching modes.

The signal generator 50 sets the switching mode, for the voltage vectors within one modulation cycle Tsw to appear in an order of the selected reactive voltage vector, the even-number voltage vector having a shorter appearance time from among the selected active voltage vectors, the even-number voltage vector having a longer appearance time from among the selected active voltage vectors, and the even-number voltage vector having the shorter appearance time from among the selected active voltage vectors. FIG. 27 shows an example of the instruction voltage vector V$\alpha\beta$ belonging to section F. As shown in FIG. 27, voltage vectors are arranged in an order of the selected seventh vector V7, the selected sixth vector V6, the selected fourth vector V4, and the selected sixth vector V6 for each modulation cycle Tsw.

In FIG. 27, the appearance time of each of the fourth vector V4 and the seventh vector V7 in one modulation cycle Tsw is set to have the twofold duration, that is, twice as long or more, of the period Tsta for the ringing convergence.

Other Embodiments

The above embodiments may be modified as follows.

The instruction signal to be compared with the carrier signal is not limited to the instruction time ratio, but may also be an instruction voltage. In such case, the amplitude of the carrier signal may be variably set according to the magnitude of the amplitude of the instruction voltage.

The control of the rotating electric machine 10 may be performed using the rotation angle information of the rotating electric machine 10 detected by an angle sensor such as a Hall element or a resolver, without performing position sensor-less control.

The switches constituting the inverter are not limited to MOSFET, but may also be an IGBT, for example. In such case, a high potential terminal of the switch is a collector and a low potential terminal is an emitter. In addition, free wheel diodes are connected in antiparallel or reversely to the switches.

Further, the switches constituting the inverter 20 are not limited to the voltage control type, but may also be a current control type, such as a bipolar transistor or the like.

The control amount of the rotating electric machine is not limited to the rotation speed, but may also be, for example, a torque.

The rotating electric machine is not limited to the star-connection type, but may also be the $\Delta$-connection type. Further, the rotating electric machine is not limited to the one used to drive an in-vehicle accessory, but may also be the one used as an in-vehicle travel power source, providing thrusting power for a travel of the vehicle. In addition, the rotating electric machine is not limited to a permanent magnet synchronous machine, but may also be, for example, a winding field type synchronous machine or a synchronous reluctance motor.

What is claimed is:

1. A controller of a system, wherein the system includes an inverter having switches in upper and lower arms of three phases, a rotating electric machine of synchronous type electrically connected to the inverter, and shunt resistors electrically connected to the switches only in the upper arm or the lower arm of the three phases, the controller comprising:

a current detector configured to detect a voltage of each of the shunt resistors during a period in which the shunt resistors in at least two of the three phases have an electric current flowing therein; and a setter configured to set a switching mode of each of the switches of the inverter for controlling a control amount of the rotating electric machine to an instruction value based on the detected voltage of each of the shunt resistors, wherein the setter sets the switching mode of each of the switches to flow the electric current to the shunt resistors in the at least two of the three phases during at least part of one half of one modulation cycle for the control of the control amount, the period comprises a period of a zero vector during which electric current of the three phases is detectable, the setter sets the switching mode of each of the switches to flow the electric current to the shunt resistors in the at least two of the three phases during the period and the current detector detects the voltage of the shunt resistors in the at least two of the three phases, and each modulation cycle of the carrier signal comprises two periods such that the voltage of the shunt resistors in the at least two of the three phases is detected twice during each modulation cycle.

2. The controller of claim 1, wherein the setter sets the switching mode according to a pulse width modulation based on a comparison of magnitudes between an instruction signal and a carrier signal, the upper and lower arms are provided either as a detector arm having the shunt resistors or a non-detector arm not having the shunt resistors, the switching mode includes a non-detector arm ON mode in which all of the switches in the non-detector arm are turned ON, the setter changes, on a condition that a current switching mode currently being set is the non-detector arm ON mode, and the current switching mode changes to a different switching mode in which (i) all of the switches in the non-detector arm are turned OFF and (ii) all of the switches in the detector arm are turned ON during at least part of a non-detector arm ON period in which the switching mode is set to the non-detector arm ON mode, including a carrier signal extremal timing at which the carrier signal takes an extreme value.

3. The controller of claim 1, wherein the setter sets the switching mode by a space vector modulation for using an average voltage vector in the one modulation cycle as an instruction voltage vector, based on a condition of flowing the electric current in the shunt resistors of the at least two phases in the at least part of one half of the one modulation cycle.

4. The controller of claim 1, further comprising:

a high frequency applicator configured to apply a high frequency voltage to winding of the rotating electric machine;

a high frequency detector configured to detect, based on the voltage detected by the current detector, a high frequency current flowing in the winding accompanying an application of the high frequency voltage; and an estimator configured to estimate a magnetic pole position of the rotating electric machine based on the high frequency current detected by the high frequency detector, wherein the high frequency applicator applies a high frequency voltage having a same cycle as the duration of the modulation cycle, the high frequency detector detects the high frequency current every time the high frequency current applied by the high frequency applicator changes, and the estimator estimates the magnetic pole position every time the high frequency current is detected by the high frequency detector.

5. The controller of claim 2, wherein the at least part of the non-detector arm ON period, including the carrier signal extremal timing, has at least a twofold duration of a ringing convergence period within which a ringing of the electric current flowing in the shunt resistor accompanying a switching of the switching modes converges after the switching of the switching modes.

6. The controller of claim 3, wherein the shunt resistors are electrically connected only to the lower arm switches, and the setter performs the switching mode setting process that (i) selects two type active voltage vectors binding the instruction voltage vector with a 60 degree phase difference and a reactive voltage vector and (ii) arranges, within the one modulation cycle, the voltage vectors to appear in an order of (a) the selected reactive voltage vector, (b) an even-number voltage vector from among the selected active voltage vectors, and (c) an odd-number voltage vector then the even-number voltage vector from among the selected active voltage vectors.

7. The controller of claim 3, wherein the shunt resistors are electrically connected only to the lower arm switches, the setter includes a selector and a changer, the selector selecting (i) two type active voltage vectors binding the instruction voltage vector with 60 degree phase difference and (ii) a reactive voltage vector, and the changer, if the selected reactive voltage vector includes a reactive voltage vector indicative of a switching mode in which each of the all lower arm switches is turned OFF and each of the all upper arm switches is turned ON, converting the selected reactive voltage vector to a reactive voltage vector indicative of a switching mode in which each of the all lower arm switches is turned ON and each of the all upper arm switches is turned OFF, and the setter performs the switching mode setting process that arranges, within one modulation cycle, the voltage vectors to appear in an order of (a) the selected reactive voltage vector, (b) an odd-number voltage vector from among the selected active voltage vectors, (c) an even-number voltage vector from among the selected active voltage vectors, (d) the changed reactive voltage vector, and (e) the even-number active voltage vector and the odd-number active voltage vector.

8. The controller of claim 3, wherein the shunt resistors are electrically connected only to the upper arm switches, the setter performs the switching mode setting process that (i) selects two type active voltage vectors binding the instruction voltage vector with a 60 degree phase difference and a reactive voltage vector, and (ii) arranges, within one modulation cycle, the voltage vectors to appear in an order of (a) the selected reactive voltage vector, (b) an odd-number voltage vector from among the selected active voltage vectors, and (c) an even-number voltage vector then the odd-number voltage vector from among the selected active voltage vectors.

9. The controller of claim 3, wherein the shunt resistors are electrically connected only to the upper arm switches, the setter includes a selector and a changer, the selector selecting (i) two type active voltage vectors binding the instruction voltage vector with a 60 degree phase difference and (ii) a reactive voltage vector, and the changer, if the selected reactive voltage vector includes a reactive voltage vector indicative of a switching mode in which each of the all lower arm switches is turned ON and each of the all upper arm switches is turned OFF, changing the selected reactive voltage vector to a reactive voltage vector indicative of a switching mode in which each of the all upper arm switches is turned ON and each of the all lower arm switches is turned OFF, and the setter performs the switching mode setting process that arranges, within the one modulation cycle, the voltage vectors to appear in an order of (a) the converted reactive voltage vector, (b) an odd-number voltage vector from among the selected active voltage vectors, (c) an even-number voltage vector from among the selected active voltage vectors, (d) the selected reactive voltage vector, and (e) the even-number active voltage vector and the odd-number active voltage vector.

10. The controller of claim 3, wherein the setter performs the switching mode setting process that (i) selects two type active voltage vectors binding the instruction voltage vector with 60 degree phase difference and an reactive voltage vector, and (ii) arranges, within the one modulation cycle, the voltage vectors to appear in an order of (a) the selected reactive voltage vector, (b) a voltage vector having a shorter appearance period from among the selected active voltage vectors, and (c) a voltage vector having a longer appearance period from among the selected active voltage vectors.

11. The controller of claim 5, wherein the switching mode set according to the pulse width modulation has a configuration which includes (i) a first period in which all the switches in the upper arm are turned ON and all the switches in the lower arm are turned OFF and (ii) a second period in which all the switches in the upper arm are turned OFF and all the switches in the lower arm are turned ON.

12. The controller of claim 5, wherein the switching mode set according to the pulse width modulation has a configuration in which (i) a first period in which all the switches in the upper arm are turned ON and all the switches in the lower arm are turned OFF has a same duration as (ii) a second period in which all the switches in the upper arm are turned OFF and all the switches in the lower arm are turned ON.

13. The controller of claim 6, wherein an appearance period of each of the reactive voltage vector and the odd-number voltage vector is set to be equal to or longer than a twofold duration of a ringing convergence period for converging a ringing of the electric current flowing in the shunt resistor after switching mode switching, which is caused accompanying the switching of the switching mode.

14. The controller of claim 7, wherein an appearance period of the converted reactive voltage vector is made equal to an appearance period of the pre-changed reactive voltage vector.

15. The controller of claim 8, wherein an appearance period of each of the reactive voltage vector and the even-number voltage vector is set to be equal to or longer than a twofold duration of a ringing convergence period for converging a ringing of the electric current flowing in the shunt resistor after switching mode switching, which is caused accompanying the switching of the switching mode.

16. The controller of claim 10, wherein an appearance period of each of the reactive voltage vector and the voltage vector having the longer appearance period is set to be equal to or longer than a twofold duration of a ringing convergence period after a switching of the switching mode for converging a ringing of the electric current flowing in the shunt resistor which is caused by the switching of the switching mode.

* * * * *